US012211549B1

(12) United States Patent
Asnaashari et al.

(10) Patent No.: US 12,211,549 B1
(45) Date of Patent: Jan. 28, 2025

(54) CELL CYCLING TO MINIMIZE RESISTIVE MEMORY RANDOM NUMBER CORRELATION

(71) Applicant: Crossbar, Inc., Santa Clara, CA (US)

(72) Inventors: Mehdi Asnaashari, Danville, CA (US); Sung Hyun Jo, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 18/596,150

(22) Filed: Mar. 5, 2024

Related U.S. Application Data

(63) Continuation of application No. 17/704,526, filed on Mar. 25, 2022, now Pat. No. 11,923,005.

(51) Int. Cl.
*G11C 13/00* (2006.01)
(52) U.S. Cl.
CPC ...... *G11C 13/0069* (2013.01); *G11C 13/0097* (2013.01)

(58) Field of Classification Search
CPC .................................................. G11C 13/0002
See application file for complete search history.

(56) References Cited

U.S. PATENT DOCUMENTS

2022/0005527 A1* 1/2022 Nazarian ............ G11C 13/0002

* cited by examiner

*Primary Examiner* — Jason Lappas
(74) *Attorney, Agent, or Firm* — Wegman Hessler Valore

(57) ABSTRACT

Stochastic or near-stochastic physical characteristics of resistive switching devices are utilized for generating data distinct to those resistive switching devices. The distinct data can be utilized for applications related to electronic identification or random number generation. As one example, data generated from physical characteristics of resistive switching devices on a semiconductor chip can be utilized to form a distinct identifier sequence for that semiconductor chip, utilized for verification applications for communications with the semiconductor chip or utilized for generating cryptographic keys or the like for cryptographic applications.

20 Claims, 17 Drawing Sheets

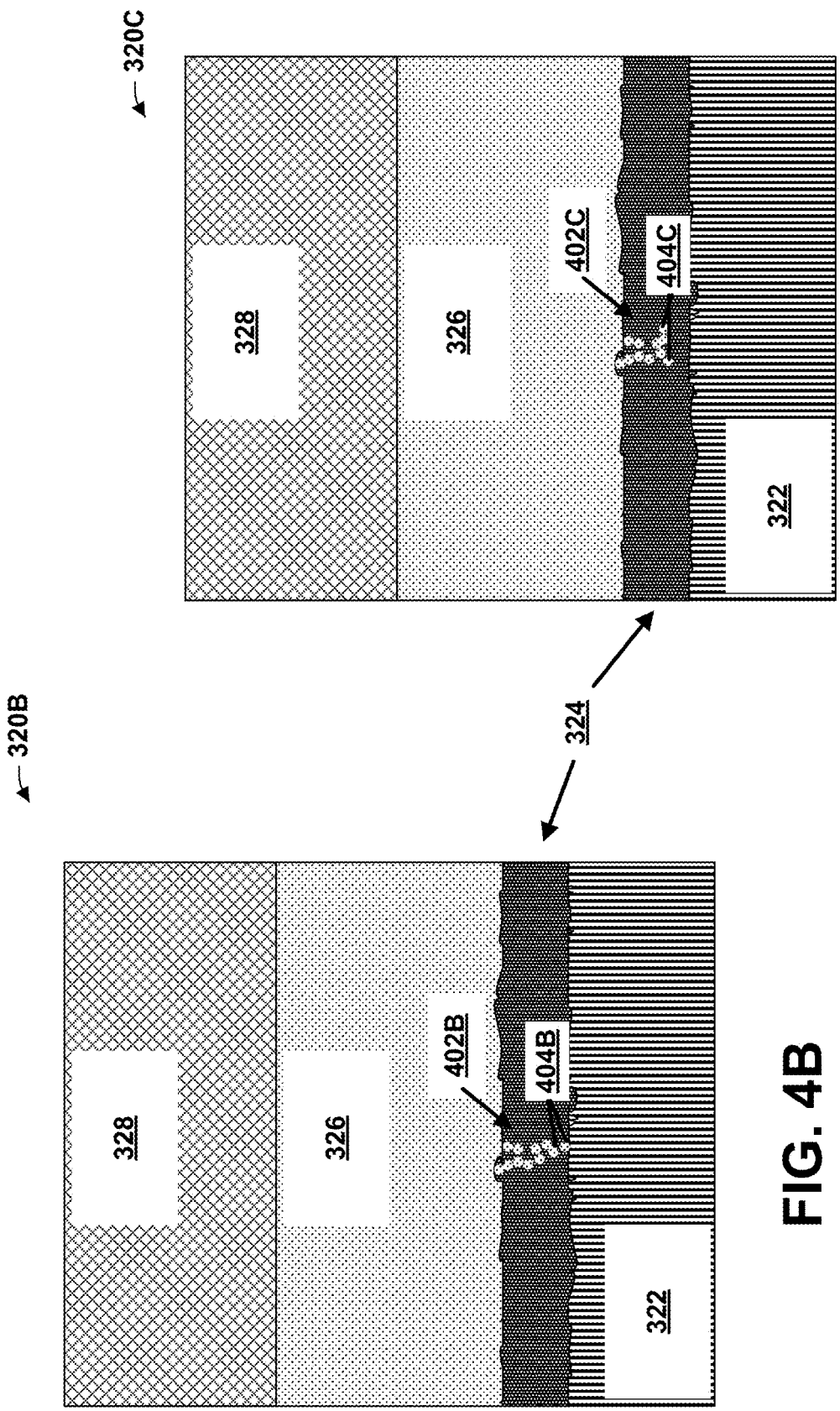

CELL CYCLING TO MINIMIZE RESISTIVE MEMORY RANDOM NUMBER CORRELATION

CROSS-REFERENCE TO RELATED APPLICATION

This application for patent is a continuation of and claims priority to U.S. application Ser. No. 17/704,526, titled CELL CYCLING TO MINIMIZE RESISTIVE MEMORY RANDOM NUMBER CORRELATION and filed Mar. 25, 2022, which is hereby incorporated by reference herein in its entirety and for all purposes.

INCORPORATION BY REFERENCE

U.S. patent application Ser. No. 17/223,817 filed Apr. 6, 2021 and titled "DISTINCT CHIP IDENTIFIER SEQUENCE UTILIZING UNCLONABLE CHARACTERISTICS OF RESISTIVE MEMORY ON A CHIP" and U.S. Provisional Application No. 63/005,879 filed Apr. 6, 2020 and titled "RESISTIVE RANDOM ACCESS DEVICE, SYSTEM AND FABRICATION TECHNIQUES" are hereby incorporated by reference herein in their respective entireties and for all purposes.

TECHNICAL FIELD

The subject disclosure relates generally to two-terminal resistive switching memory, and as one illustrative example, employing stochastic characteristics of resistive switching devices for generating distinct digital values.

BACKGROUND

Resistive-switching memory represents a recent innovation within the field of integrated circuit technology. While much of resistive-switching memory technology is in the development stage, various technological concepts for resistive-switching memory have been demonstrated and are in one or more stages of verification to prove or disprove associated theories or techniques. Resistive-switching memory technology is expected to show compelling evidence of substantial advantages over competing technologies in the semiconductor electronics industry in the near future.

Proposals for practical utilization of resistive-switching technology to memory applications for electronic devices have been put forth. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors, for instance.

In light of the above, the Assignee of the present disclosure continues to develop and pursue practical utilizations of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Embodiments of the present disclosure provide for leveraging physical characteristics of resistive switching devices to generate data distinct to those resistive switching devices. That distinct data can be utilized for various purposes related to electronic identification. As one example, data generated from physical characteristics of resistive switching devices on a semiconductor chip can be utilized to form a distinct identifier sequence or for generating random or pseudo-random data.

Still other embodiments disclose a variety of measurably distinct qualities of resistive switching devices that can be utilized to generate distinct identifier data. Examples include original leakage current(s) of a device or group of devices, original electrical resistance of a device(s), original switching speed of a device(s), original program voltage of a device(s), differential program speed of groups of devices, differential program voltage(s) of groups of devices, as well as other examples disclosed herein or that may be known in the art, or reasonably conveyed to one of ordinary skill in the art by way of the context provided herein.

In one or more disclosed embodiments, provided are methods for generating random numbers based on physical unclonable feature (PUF) data from resistive switching memory cells or data generated via similar techniques that enhance longevity and randomness of the memory cells and techniques used to generate those random numbers. As an example, differential programming techniques discussed herein can be used to generate random bits, etc., based on which memory cell(s) programs before others out of a group of memory cells. Various embodiments can employ these techniques with native (e.g., never-programmed) memory cells and/or can re-apply these techniques with memory cells that have been programmed and erased the same or a similar (e.g., within a threshold, etc.) number of times.

In further embodiments, disclosed is a method for operating a circuit, comprising: grouping a set of resistive switching devices into a plurality of subsets of resistive switching devices, wherein each subset of the plurality of subsets comprises the same number of resistive switching devices; for each subset of the plurality of subsets: applying a programming cycle to each resistive switching device of that subset; monitoring that subset for a first program event among the resistive switching devices of that subset; terminating the programming cycle in response to detecting the first program event among the resistive switching devices of that subset; and assigning an associated digital value to that subset based on an identity of a resistive switching device of that subset associated with the first program event among the resistive switching devices of that subset; and constructing a random number from the associated digital values of the plurality of subsets of resistive switching devices.

In another embodiment is disclosed a method of operating a semiconductor device comprising resistive switching devices. The method can comprise grouping a set of resistive switching devices into a plurality of pairs of resistive switching devices; for each pair of the plurality of pairs: applying a programming cycle to each resistive switching device of that pair; monitoring that pair for a first program event among the resistive switching devices of that pair; terminating the programming cycle in response to detecting the first program event among the resistive switching devices of that pair; and assigning an associated digital value to that pair based on an identity of a resistive switching device of that pair associated with the first program event among the resistive switching devices of that pair; constructing a random number from the associated digital values of the plurality of pairs of resistive switching devices; programming each resistive switching device of the set of resistive switching devices; and erasing each resistive switching device of the set of resistive switching devices.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

FIGS. 4B and 4C depict example RS devices and filament formation and deformation according to one or more disclosed embodiments;

DETAILED DESCRIPTION

Introduction

Figure 1:
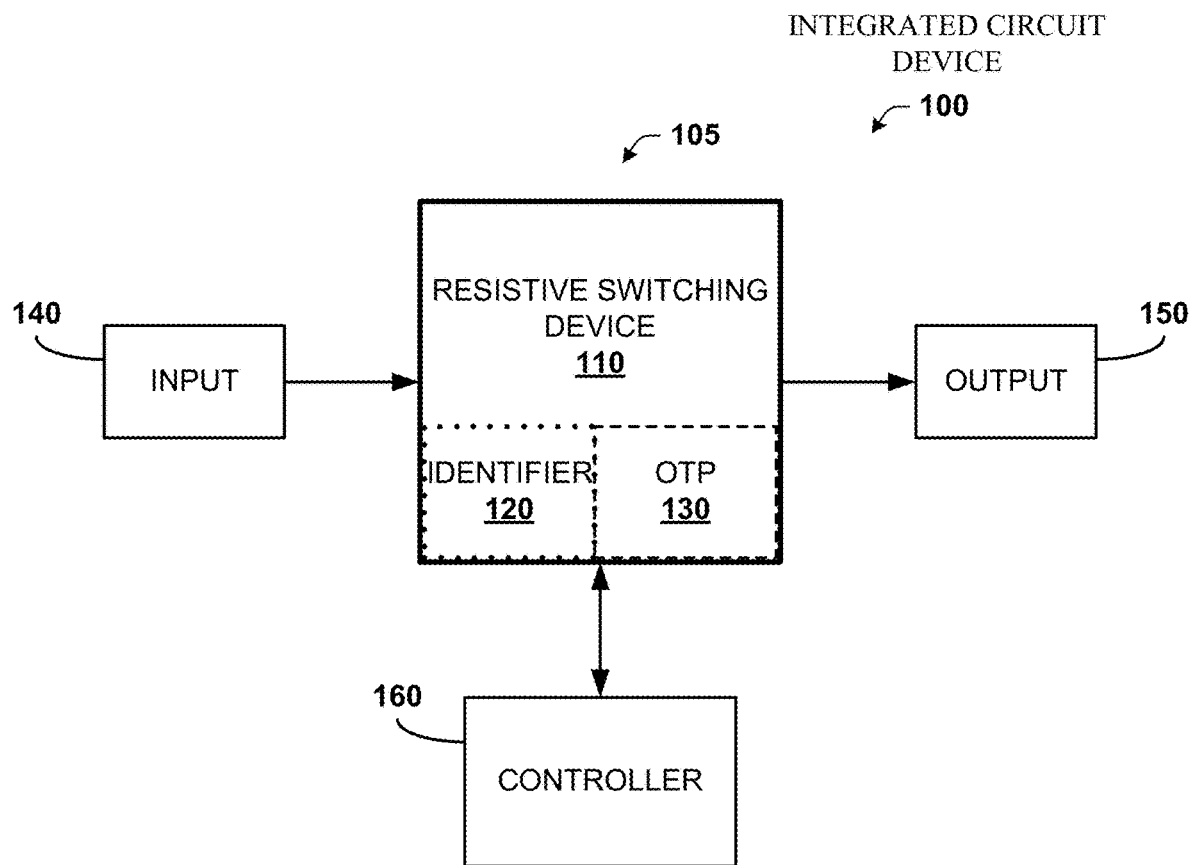
FIG. 1 depicts a block diagram of a sample electronic device providing control over processes for generating resistive switching (RS) device identifier data, in an embodiment.

One or more embodiments of the present disclosure leverage stochastic or substantially stochastic physical characteristics of nano-scale resistive switching devices to generate data. Being generally random, stochastic features of resistive switching devices can be leveraged to produce data that has little to no correlation among a population of such devices (e.g., see FIG. 6, infra). As a result, that data can be suited to applications requiring distinct or unique identification, such as identification and authorization applications pertaining to a device (e.g., a semiconductor die—also referred to herein as a semiconductor chip—or a semiconductor wafer, group(s) of dies, group(s) of wafers, an electronic device incorporating a semiconductor die(s), and so forth). Further, highly non-correlated data can also be utilized for security applications, such as random number generation, cryptography key generation applications, and the like.

In addition, various embodiments disclose resistive switching device processes utilized to generate high-entropic data sequences (e.g., see FIGS. 5 and 8, infra) that meet or exceed scientific standards for randomness, and are comparable with high-quality cryptographic random number sources. Moreover, the switching device processes utilized to generate data sequences can be selected from native resistive switching devices (e.g., devices that have not previously been programmed, and are original or virgin devices post-fabrication) that most closely leverage nano-scale unclonable physical characteristics of the resistive switching devices. This achieves high non-correlation among devices on a die (intra-die), among dies on a wafer (inter-die) and among wafers in a fabrication facility, minimizing likelihood that a data sequence generated from resistive switching devices on a single die is repeated by other devices on that same die, or repeated by other resistive switching devices on a given wafer, or on different wafers.

Additionally, various embodiments disclose techniques and/or methods of employing previously programmed and erased resistive switching devices to generate high-entropic data sequences (e.g., see FIGS. 5 and 8, infra) that also meet or exceed scientific standards for randomness, and are comparable with high-quality cryptographic random number sources. Differential programming techniques discussed herein can be employed in connection with sets of resistive switching devices that have been programmed and erased the same number of times as each other or within a threshold number of the same number of times, to repeatedly generate random numbers with high entropy a large number of times (e.g., on the order of 10,000, etc.).

Still further, disclosed resistive switching devices can be constructed among electromagnetically opaque metal lines of a semiconductor die (e.g., among backend-of-line wiring structures that are non-transparent to a fairly large portion of the electromagnetic imaging spectrum; visible light, UV light, infrared light, etc.) exacerbating the difficulty involved in illicit side-channel access techniques such as unauthorized device layer microscopy. In one or more additional embodiments, some disclosed sequence generation processes can be rendered permanent through one-time programmable processes, allowing a sequence to be reliably re-read over a very large number of read cycles to reliably and accurately reproduce a previously generated data sequence, achieving extremely low bit error rates (e.g., see FIG. 7, infra). In still further embodiments, disclosed processes for generating non-correlated data sequences can involve processes compatible with resistive switching device operation, allowing a set of resistive switching devices to be selected post-fabrication from any suitable subset of resistive switching devices on a chip. Systems and methods are further provided to export control of resistive switching device selection, data sequence process selection and process configuration-associated with physically unclonable data sequence generation disclosed herein—to a user of the chip post-fabrication. Various other embodiments will be readily apparent based on the disclosure herein and the associated drawings.

As utilized herein, the term "substantially" and other relative terms or terms of degree (e.g., about, approximately, substantially, and so forth) are intended to have the meaning specified explicitly in conjunction with their use herein, or a meaning which can be reasonably inferred by one ordinary skill in the art, or a reasonable variation of a specified quality(ies) or quantity(ies) that would be understood by one of ordinary skill in the art by reference to this entire specification (including the knowledge of one of ordinary skill in the art as well as material incorporated by reference herein). As an example, a term of degree could refer to reasonable manufacturing tolerances about which a specified quality or quantity could be realized with fabrication equipment. Thus, as a specific illustration, though non-limiting, for an element of a resistive switching device expressly identified as having a dimension of about 50 angstroms (A), the relative term "about" can mean reasonable variances about 50 A that one of ordinary skill in the art would anticipate the specified dimension of the element could be realized with commercial fabrication equipment, industrial fabrication equipment, laboratory fabrication equipment, or the like, and is not limited to a mathematically precise quantity (or quality). In other examples, a term of degree could mean a variance of +/−0-3%, +/−0-5%, or +/−0-10% of a expressly stated value, where suitable to one of ordinary skill in the art to achieve a stated function or feature of an element disclosed herein. In still other examples, a term of degree could mean any suitable variance in quality (ies) or quantity (ies) that would be suitable to accomplish one or more explicitly disclosed function(s) or feature(s) of a disclosed element. Accordingly, the subject specification is by no means limited only to specific qualities and quantities disclosed herein, but includes all variations of specified quality (ies) or quantity (ies) reasonably conveyed to one of ordinary skill in the art by way of the context disclosed herein.

As the name implies, a two-terminal resistive switching device has two terminals or electrodes. Herein, the terms "electrode" and "terminal" are used interchangeably; moreover, a two-terminal resistive switching device includes a non-volatile two-terminal memory device as well as a volatile two-terminal switching device. Generally, a first electrode of a two-terminal resistive switching device is referred to as a "top electrode" (TE) and a second electrode of the two-terminal resistive switching device is referred to as a "bottom electrode" (BE), although it is understood that electrodes of two-terminal resistive switching devices can be according to any suitable arrangement, including a horizontal arrangement in which components of a memory cell are (substantially) side-by-side rather than overlying one another. Between the TE and BE of a two-terminal resistive switching device is typically an interface layer sometimes referred to as a switching layer, a resistive switching medium (RSM) or a resistive switching layer (RSL); such devices are not limited to these layers, however, as one or more barrier layer(s), adhesion layer(s), ion conduction layer(s), seed layer(s), particle source layer(s) or the like—as disclosed herein, disclosed within a publication incorporated by reference herein, as generally understood and utilized in the art or reasonably conveyed to one of ordinary skill in the art by way of the context provided herein and its addition to the general understanding in the art or the incorporated publications—may be included between or adjacent one or more of the TE, the BE or the interface layer consistent with suitable operation of such device.

Composition of memory cells, generally speaking, can vary per device with different components, materials or deposition processes selected to achieve desired characteristics (e.g., stoichiometry/non-stoichiometry, volatility/non-volatility, on/off current ratio, switching time, read time, memory durability, program/erase cycle, and so on). One example of a filamentary-based device can comprise: a conductive layer, e.g., metal, metal-alloy, metal-nitride, (e.g., comprising TiN, TaN, TiW, or other suitable metal compounds), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.)), a resistive switching layer (RSL) and an active metal-containing layer capable of being ionized. Under suitable conditions, the active metal-containing layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer. A memory cell having such characteristics may be described as a filamentary-based device.

A RSL (which can also be referred to in the art as a resistive switching media (RSM)) can comprise, e.g., an undoped amorphous Si-containing layer, a semiconductor layer having intrinsic characteristics, a stoichiometric or non-stoichiometric silicon nitride (e.g., SiN, $Si_3N_4$, $SiN_x$, etc.), a Si sub-oxide (e.g., $SiO_x$ wherein x has a value between 0.1 and 2), a Si sub-nitride, a metal oxide, a metal nitride, a non-stoichiometric silicon compound, and so forth. Other examples of materials suitable for the RSL could include $Si_xGe_yO_z$ (where x, y and z are respective suitable positive numbers), a silicon oxide (e.g., $SiO_N$, where N is a suitable positive number), a silicon oxynitride, an undoped amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number) and so forth, a nitride (e.g., AlN, SiN), or a suitable combination thereof.

In some embodiments, a RSL employed as part of a non-volatile memory device (non-volatile RSL) can include a relatively large number (e.g., compared to a volatile selector device) of material voids or defects to trap neutral metal particles (e.g., at low voltage) within the RSL. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. In other embodiments, a RSL employed for a volatile selector device (volatile RSL) can have very few material voids or defects for trapping particles. Because of the few particle-trapping voids/defects, a conductive filament formed in such an RSL can be quite thin (e.g., one to a few particles wide depending on field strength, particle material or RSL material, or a suitable combination of the foregoing), and unstable absent a suitably high external stimulus (e.g., an electric field, voltage, current, joule heating, or a suitable combination thereof). Moreover, the particles can be selected to have high surface energy, and good diffusivity within the RSL. This leads to a conductive filament that can form rapidly in response to a suitable stimulus, but also deform quite readily, e.g., in response to the external stimulus dropping below a deformation magnitude (which can be lower than a formation magnitude of the external stimulus associated with forming the volatile conductive filament, e.g., in response to a current flowing through the selector device; see U.S. Pat. No. 9,633,724 B2 hereby incorporated by reference herein in its entirety and for all purposes). Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as stoichiometric or non-stoichiometric: compounds, nitrides, oxides, alloys, mixtures or combinations of the foregoing or similar materials can be employed for the active metal-containing layer in some aspects of the subject disclosure. Further, a non-stoichiometric compound, such as a non-stoichiometric metal oxide/metal-oxygen or metal nitride/metal nitrogen (e.g., $AlO_x$, $AlN_x$, $CuO_x$, $CuN_x$, $AgO_x$, $AgN_x$, and so forth, where x is a suitable positive number or range of numbers, such as: $0<x<2$, $0<x<3$, $0<x<4$ or other number/range of numbers depending on metal compound, which can have differing values for differing ones of the non-stoichiometric compounds) or other suitable metal compound can be employed for the active metal-containing layer, in at least one embodiment.

In one or more embodiments, a disclosed filamentary resistive switching device can include an active metal layer comprising a metal-nitrogen selected from the group consisting of: $TiN_x$, $TaN_x$, $AlN_x$, $CuN_x$, $WN_x$ and $AgN_x$, where x is a positive number (or range of numbers) that can vary per metal-nitrogen material. In a further embodiment(s), the active metal layer can comprise a metal-oxygen selected from the group consisting of: $TiO_x$, $TaO_x$, $AlO_x$, $CuO_x$, $WO_x$ and $AgO_x$ where x is a positive number (or range of numbers) that can likewise vary per metal-oxygen material. In yet another embodiment(s), the active metal layer can comprise a metal oxygen-nitrogen selected from the group consisting of: $TiO_aN_b$, $AlO_aN_b$, $CuO_aN_b$, $WO_aN_b$ and $AgO_aN_b$, where a and b are suitable positive numbers/ranges of numbers. The disclosed filamentary resistive switching device can further comprise a switching layer comprising a switching material selected from the group consisting of: $SiO_y$, $AlN_y$, $TiO_y$, $TaO_y$, $AlO_y$, $CuO_y$, $TiN_x$, $TiN_y$, $TaN_x$, $TaN_y$, $SiO_x$, $SiN_y$, $AlN_x$, $CuN_x$, $CuN_y$, $AgN_x$, $AgN_y$, $TiO_x$, $TaO_x$, $AlO_x$, $CuO_x$, $AgO_x$, and $AgO_y$, where x and y are positive numbers (or ranges), and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a stoichiometric or non-stoichiometric metal compound (or mixture) and a resistive switching layer. In one alternative embodiment of this example, the particle donor layer comprises a metal-nitrogen: $MN_x$, e.g., $AgN_x$, $TiN_x$, $AlN_x$, etc., and the resistive switching layer comprises a metal-nitrogen: $MN_y$, e.g., $AgO_y$, $TiO_y$, $AlO_y$, and so forth, where y and x are positive numbers (or ranges), and in some cases y is larger than x. In an alternative embodiment of this example, the particle donor layer comprises a metal-oxygen: $MO_x$, e.g., $AgO_x$, $TiO_x$, $AlO_x$, and so on, and the resistive switching layer comprises a metal-oxygen: $MO_y$, e.g., $AgO_y$, $TiO_y$, $AlO_y$, or the like, where y and x are positive numbers (or ranges), and in some cases y is larger than x. In yet another alternative, the metal compound of the particle donor layer is a $MN_x$ (e.g., $AgN_x$, $TiN_x$, $AlN_x$, etc.), and the resistive switching layer is selected from a group consisting of $MO_y$ (e.g., $AgO_y$, $TiO_y$, $AlO_y$, etc.) and $SiO_y$, where x and y are typically non-stoichiometric values, or vice versa in a still further embodiment.

As utilized herein, variables x, y, a, b, and so forth representative of values or ratios of one element with respect to another (or others) in a compound or mixture can have different values (or ranges) suitable for respective compounds/mixtures, and are not intended to denote a same or similar value or ratio among the compounds. Mixtures can refer to non-stoichiometric materials with free elements therein-such as metal-rich nitride or oxide (metal-oxide/nitride with free metal atoms), metal-poor nitride or oxide (metal-oxide/nitride with free oxygen/nitrogen atoms)—as well as other combinations of elements that do not form traditional stoichiometric compounds as understood in the art. Some details pertaining to embodiments of the subject disclosure can be found in the following U.S. patent applications that are licensed to the assignee of the present application for patent: application Ser. No. 11/875,541 filed Oct. 19, 2007 and application Ser. No. 12/575,921 filed Oct. 8, 2009; each of the foregoing patent applications are hereby incorporated by reference herein in their respective entireties and for all purposes in addition to those incorporated by reference elsewhere herein.

It should be appreciated that various embodiments herein may utilize a variety of memory cell technologies, having different physical properties. Such physical properties can be associated with a fabrication process or processes, and can have stochastic or substantially stochastic characteristics that mitigate or avoid replication or repetition among fabricated memory cells, even when made by the same process. As one example, one or more layers of a disclosed resistive switching device can have a root mean square (RMS) surface roughness of >0.2 nm (e.g., see FIG. 4A, infra), up to a maximum of about 10.0 nm surface roughness, in an embodiment. This results in random or near-random variation in layer thickness, including unpredictable changes in physical characteristics of such devices. In some theoretical models the RMS surface roughness can affect the geometry of a resistive switching material layer inducing stochastic or substantially stochastic variations in resistive switching devices properties such as: native or virgin (e.g., as fabricated) current conductance, program voltage, differential program voltage, program speed, differential program speed, among others disclosed throughout this specification. As further examples, different resistive-switching memory cells and cell technologies can have different discrete programmable resistances, different associated program/erase voltages, as well as other differentiating characteristics. In an embodiment, a resistive switching memory device resulting from a 28 nm photolithographic process with device size between about 50 nanometer (nm) width and about 130 nm width (e.g., about 100 nm width, about 56 nm width, about 75 nm width, about 128 nm width, and so forth) can be suitable to achieve stochastic physical characteristics disclosed herein. In other embodiments, a 22 nm photolithographic process producing a device size between 40 nm and 100 nm width (e.g., about 44 nm width, about 60 nm width, about 66 nm width, about 88 nm width, and so forth) can achieve stochastic physical characteristics. Various embodiments can employ the stochastic or substantially stochastic variations in native or virgin (e.g., as fabricated) current conductance to generate sequences (e.g., for cryptography, die identification, etc.), and can program bits above or below a threshold current to a high enough current to ensure that a suitable sensing current can be selected such that there are no bits within sensing margins of that sensing current.

Upon fabrication, disclosed resistive-switching devices can have native physical features generated from the fabrication process utilized to produce the resistive switching devices. These native physical features can have inherent stochastic or substantially stochastic properties that vary from resistive switching device to resistive switching device in a group of such devices (e.g., see FIGS. 4, 4A, 4B and 4C, infra), and can vary among devices in a die and among devices on a wafer or multiple wafers. As a result, minimal correlation in the native physical features among devices, dies, wafers and so forth, can yield minimal correlation between operational processes and data derived from such processes among devices, dies, wafers and so on. For instance, a native electrical resistance of a resistive switching layer (RSL) can depend at least in part on these non-correlated physical features and can vary from device to device even for adjacent devices in a single array on a single die (and, as previously stated, among multiple dies, wafers, and so on). Further, a current flow through the RSL in a native un-programmed state, a program voltage in the native un-programmed state, a program speed in the native un-programmed state, differential program voltage/current/ speed in the native un-programmed state, and so on, can vary among resistive switching devices. Processes disclosed herein for forming resistive switching devices and for leveraging stochastic or substantially stochastic physically unclonable features of resistive switching devices can provide excellent non-correlated data sequences.

As utilized herein, the term "native", "original", "virgin" or the like refers to post-fabrication but pre-commercial operation of resistive switching devices on a semiconductor die. Native (and like terminology) need not exclude some or all post-fabrication operations such as quality testing or other verification routines performed by a manufacturer, and even some pre-commercial operation by a non-manufacturer such as testing to ensure manufacturer quality specifications are met by a chip, chip setup routines or configuration routines (e.g., defining one-time programmable memory or identifier memory within an array of resistive switching memory; see e.g., FIGS. 1 and 2, infra), among others. In general a resistive switching device is in a native state, as utilized herein, if it has not yet received a stimulus (e.g., electrical, thermal, magnetic, or a like stimulus known in the art, suitable combinations thereof, and so forth) suitable to form a conductive filament within the resistive switching device and change the resistive switching device from an electrically resistive state to an electrically conductive state as described herein or known in the art. Various embodiments can employ native resistive switching devices to generate sequences for cryptography (or die identification, etc.) as discussed herein, and further embodiments can employ non-native resistive switching devices to generate digital values having high non-correlation, or randomness.

Some embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

In various embodiments, filamentary-based resistance switching devices can operate in a bipolar fashion, behaving differently in response to different polarity (or direction, energy flow, energy source orientation, etc.) external stimuli. For the volatile filamentary-based selector device, as an illustrative example, in response to a first polarity stimulus exceeding a first threshold voltage (or set of voltages), the filamentary selector device can change to a second resistance state from a first resistance state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), having the same or similar magnitude of threshold stimulus (though of opposite polarity or direction), or the like. In other embodiments, the third state can be distinct from the second state, either in terms of the measurable characteristic (e.g., different electrical conductivity value in response to the reverse polarity as compared to the forward polarity) or in terms of threshold stimulus associated with transitioning out of the first state (e.g., a different magnitude of positive voltage required to transition to the second state, compared to a magnitude of negative voltage required to transition to the third state).

For bipolar operation of a non-volatile filamentary-based memory cell, a conductive path or a filament forms through a non-volatile RSL in response to a suitable program voltage applied across the memory cell. In particular, upon application of a programming voltage, metallic ions are generated from the active metal-containing layer and migrate into the non-volatile RSL layer. The metallic ions can occupy voids or defect sites within the non-volatile RSL layer. In some embodiments, upon removal of the bias voltage, the metallic ions become neutral metal particles and remain trapped in voids or defects of the non-volatile RSL layer. When sufficient particles become trapped, a filament is formed and the memory cell switches from a relatively high resistive state, to a relatively low resistive state.

In some disclosed embodiments, completion of a conductive filament can involve only a few particles (e.g., atoms, ions, conductive compounds, etc.) of conductive material, or less. As one particular example, an electrically continuous conductive filament could be established by position of 1-3 atoms at a boundary of a switching layer, whereas repositioning of one or more of these atoms can break that electrical continuity, in some embodiments. Because the scale is so small between a completed filament and non-completed filament, illicit side-channel attempts to read bits of memory—for example through high intensity microscopy—can be very difficult, if not impossible due to the difficulty of imaging such small particles and determining whether their location is sufficient to establish electrical continuity. Still further, disclosed resistive switching devices can be formed among metal lines of a semiconductor chip (e.g., among backend-of-line wiring layers). The density of metal wiring layers further occludes visibility of the resistive switching devices, making common side-channel techniques unprofitable.

Once a conductive filament is formed, trapped conductive particles provide the conductive path or filament through the non-volatile RSL layer, and the resistance is typically determined by a tunneling resistance between one or more such particles and an electrical conductive material adjacent to the non-volatile RSL layer. In some resistive-switching devices, an erase process can be implemented to deform the conductive filament, at least in part, causing the memory cell to return to the high resistive state from the low resistive state. More specifically, upon application of an erase bias voltage, the metallic particles trapped in voids or defects of the non-volatile RSL become mobile ions and migrate back towards the active metal layer, or disassociate within the RSL (or a combination of the foregoing) to break electrical conductivity of the conductive filament through the RSL layer. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in such memory cells.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology (ies) or signal level changes are considered within the scope of the subject disclosure.

As mentioned above, applying a program voltage (also referred to as a "program pulse") to one of the electrodes of the two-terminal memory can cause a conductive filament to form in an interface layer (e.g., a RSL). By convention and as generally described herein, the TE receives the program pulse and the BE is grounded (or held at lower voltage or opposite polarity compared to the program pulse), but such is not intended to be limiting for all embodiments. Conversely, applying an "erase pulse" to one of the electrodes (generally a pulse of opposite polarity as the program pulse or to the opposite electrode as the program pulse) can break continuity of the filament, e.g., by driving the metal particles or other material that forms the filament back toward the active metal source. Properties of this conductive filament as well as its presence or absence affect the electrical characteristics of the two-terminal memory cell such as, for example, lowering the resistance and/or increasing conductance across the two terminals when the conductive filament is present as opposed to when not present.

Following program or erase pulses, a read pulse can be asserted. This read pulse is typically lower in magnitude relative to program or erase pulses and typically insufficient to affect the conductive filament and/or change the state of the two-terminal memory cell. By applying a read pulse to one of the electrodes of the two-terminal memory, a measured current (e.g., $I_{on}$) when compared to a predetermined threshold current can be indicative of the conductive state of the two-terminal memory cell. The threshold current can be preset based on expected current values in different states (e.g., high resistance state current; respective currents of one or more low resistance states, and so forth) of the two-terminal memory device, suitable for a given two-terminal memory technology. For example, when the conductive filament has been formed (e.g., in response to application of a program pulse), the conductance of the cell is greater than otherwise and the measured current (e.g., $I_{on}$) reading in response to the read pulse will be greater. On the other hand, when the conductive filament is removed (e.g., in response to application of an erase pulse), the resistance of the cell is high because the interface layer has a relatively high electrical resistance, so the conductance of the cell is lower and the measured current (e.g., $I_{off}$) reading in response to the read pulse will be lower. By convention, when the conductive filament is formed, the memory cell is said to be in the "on-state" with a high conductance. When the conductive filament is not extant, the memory cell is said to be in the "off-state". A memory cell being in the on-state or the off-state can be logically mapped to binary values such as, e.g., "1" and "O". It is understood that conventions used herein associated with the state of the cell or the associated logical binary mapping are not intended to be limiting, as other conventions, including an opposite convention can be employed in connection with the disclosed subject matter. Techniques detailed herein are described and illustrated in connection with single-level cell (SLC) memory, but it is understood that the disclosed techniques can also be utilized for multi-level cell (MLC) memory in which a single memory cell can retain a set of measurably distinct states that represent multiple bits of information.

By mapping digital information to non-volatile resistance states of a two-terminal memory cell, digital information can be stored at such device. An electronic device containing many of these two-terminal memory cells can likewise store significant quantities of data. High density arrays are configured to contain as many memory cells as possible for a given area of chip space, thereby maximizing data storage capacity of a memory chip, or system-on-chip device.

Two general conventions are utilized for two-terminal memory formed at intersections of metal lines within a wafer (e.g., a crossbar array). A first convention is the 1T1R memory array, in which each memory cell is isolated from electrical effects (e.g., current, including leak path current(s)) of surrounding circuitry by an associated transistor. A second convention is the 1TnR memory array (n being a positive number greater than one), where a group of multiple memory cells is isolated from electrical effects of surrounding circuitry by one (or more) transistors. In the 1T1R context, individual memory cells can be configured to have high current suppression between memory cells, significantly reducing leakage path currents for the 1T1R memory array. In the 1TnR context, many individual memory cells having high device density in a given amount of silicon space can be connected to a single transistor that has much lower density. Accordingly, the 1TnR context facilitates higher bit densities for resistive memory cells on a semiconductor chip.

Overview

FIG. 1 illustrates a block diagram of an example integrated circuit device 100 for an electronic device according to one or more embodiments of the present disclosure. Integrated circuit device 100 includes an array(s) of memory 105. Array(s) of memory 105 can include resistive switching devices 110, identifier memory 120 and one-time programmable (OTP) memory 130. In various embodiments, resistive switching devices 110 can include non-volatile two-terminal resistive-switching memory devices, volatile two-terminal resistive-switching devices, or a combination of non-volatile two-terminal resistive-switching memory devices and volatile two-terminal resistive-switching devices (e.g., serving as a selector device for a non-volatile memory, or independently as a volatile latch, switch, or the like). In some embodiments, array(s) of memory 105 can include other memory cell technologies, such as phase change memory, oxygen vacancy memory cells, magnetic memory, conductive bridge memory, and so forth.

Identifier memory 120 can also referred to herein as fingerprint memory, unclonable memory, random sequence memory, or the like. Identifier memory 120 and OTP memory 130 can be separate memory structures from array(s) of memory 105 (e.g., located externally to array(s) of memory 105 on a semiconductor chip) or can be at least in part included within array(s) of memory 105 (e.g., an array among a set of arrays that embody array(s) of memory 105, a block of memory within such an array(s), a set of pages within one or more blocks or arrays, or other suitable arrangement). In one embodiment(s), identifier memory 120 and OTP memory 130 can have a fixed size/number of memory cells and be pre-allocated within integrated circuit device 100. In other embodiments, identifier memory 120 and OTP memory 130 can have variable size or location controllable post-fabrication. For instance, a number of memory cells allocated to identifier memory 120 or OTP memory 130 can be dynamically increased or decreased by way of controller 160. As an illustrative example, though non-limiting, array(s) of memory 105 can have a fixed amount of memory (e.g., 65Mbytes, or other suitable value) and a first subset of the fixed amount of memory (e.g., 4Mbytes, or any other suitable value from zero to the fixed amount) can be allocated to identifier memory 120 and a second subset of the fixed amount of memory (e.g., 8Mbytes, or any other suitable value from zero to the fixed amount) can be allocated to OPT memory 130. In this example, if identifier memory 620 is not fully used for generating identifier data sequence(s) data, a portion of the first subset (e.g., 2Mbytes, and so forth) can be allocated back to resistive switching devices 110, and if more OTP is required, a third subset of resistive switching devices 110 (e.g., 4Mbytes, or other suitable value) can be allocated from resistive switching devices 110 to OTP memory 130. Any other suitable re-allocation that would be evident to one of ordinary skill in the art based on their experience in the art or based on the context provided herein is deemed to be within the scope of the present disclosure, and can be provided by controller 160 as well. However, in some embodiments, if memory has been used for fingerprinting (identifier sequence data) or programmed as OTP data, such memory can be prevented from being reallocated back as general purpose memory (or another form of memory).

Also illustrated in integrated circuit device 100 is an input(s) 140 and output(s) 150. In some embodiment, input(s) 140 can include (or provide a pathway for) data to be stored within resistive switching devices 110, identifier memory 120 or OTP memory 130. Output(s) 150 can output data stored within resistive switching devices 110, identifier memory 120 or OTP memory 130. In some embodiments, output(s) 150 can output data that results from computations utilizing data stored in identifier memory 120, or stored within resistive switching devices 110 or OTP memory 130 resulting from such computations, in further embodiments.

FIG. 1 provides a novel mechanism for exporting control over physically unclonable identifier sequence generation, post-fabrication. Use of static random access memory (SRAM) for generating identifier sequence data has met with fairly high bit error rate (BER), from 3% to 15% depending on implementation. To reduce BER associated with SRAM identifier sequence generation, complicated circuitry is coupled to the SRAM bits upon fabrication. This permanently fixes the SRAM bits that can be utilized for identifier sequence generation, and further adds significant hardware overhead to a semiconductor die. Disclosed resistive switching devices can generate identifier sequence data with extremely low BER (e.g., see FIG. 7, infra). Accordingly, embodiments disclosed herein provide circuitry and processes utilized for memory operations of the resistive switching devices (e.g., for storing data, for reading data, for rewriting data, etc.) and extend them to generating identifier sequence data. In such embodiments, resistive switching devices utilized for memory operations, identifier data or OTP storage need not be fixed on manufacture, and instead can be dynamically exposed for selection and re-configuration (e.g., by way of controller 160) post-fabrication.

Figure 5:
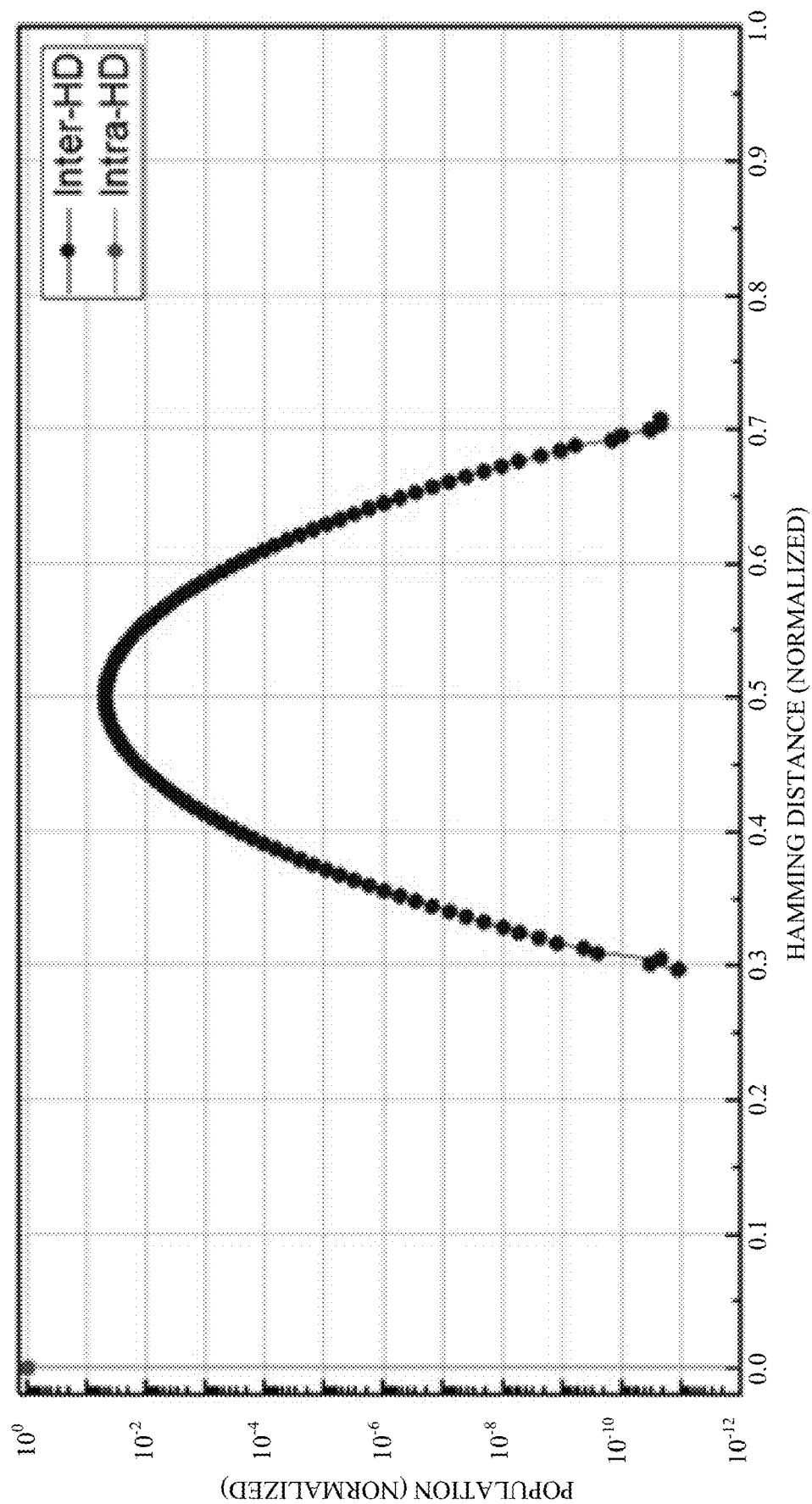
FIG. 5 illustrates an example Hamming Distance distribution for a set of RS devices within a die and among dies, in an embodiment(s)
Figure 6:
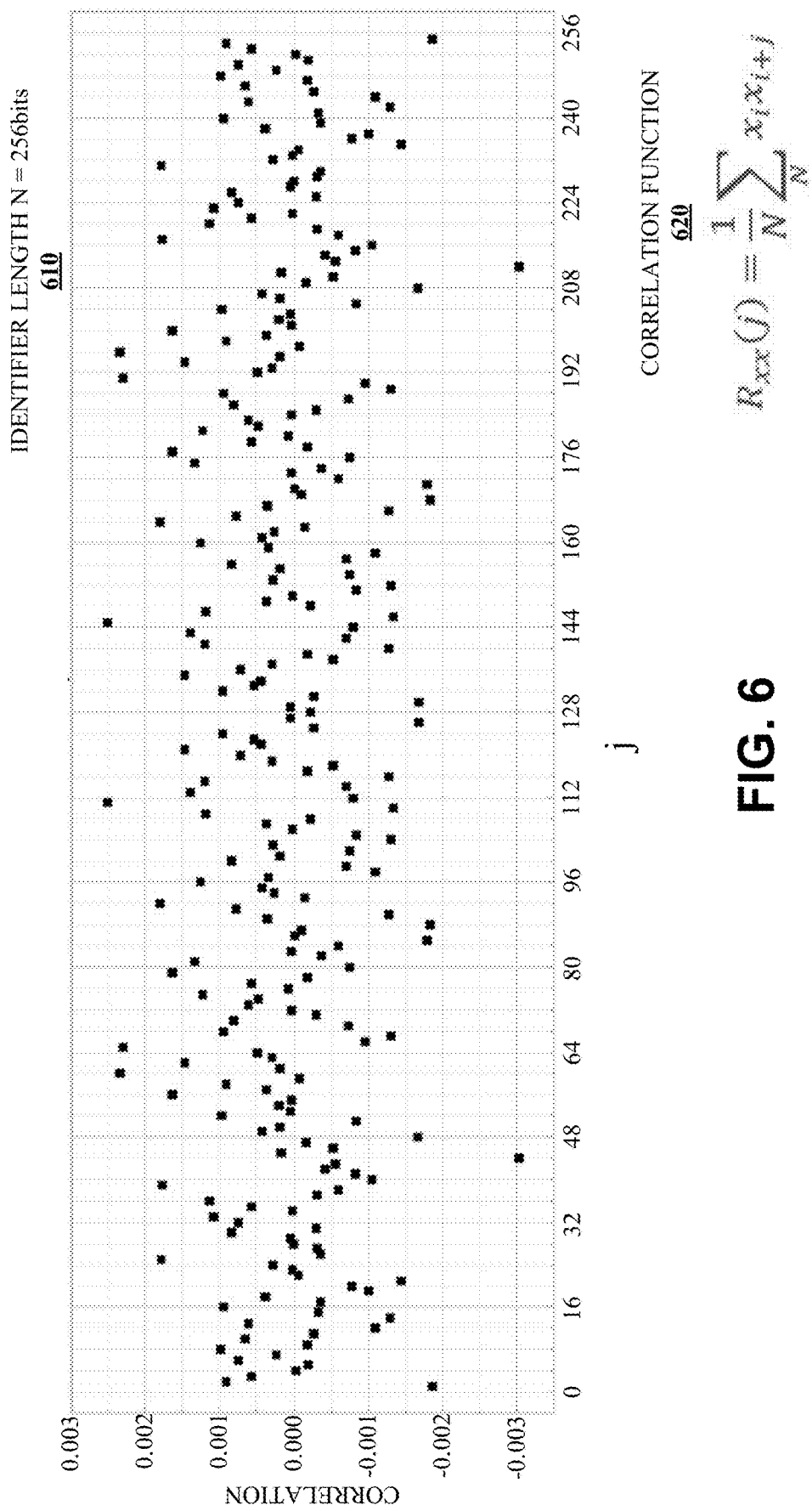
FIG. 6 depicts an example graph of cross-correlation for a 256-bit identifier sequence formed from RS devices according to further disclosed embodiments.
Figure 8:
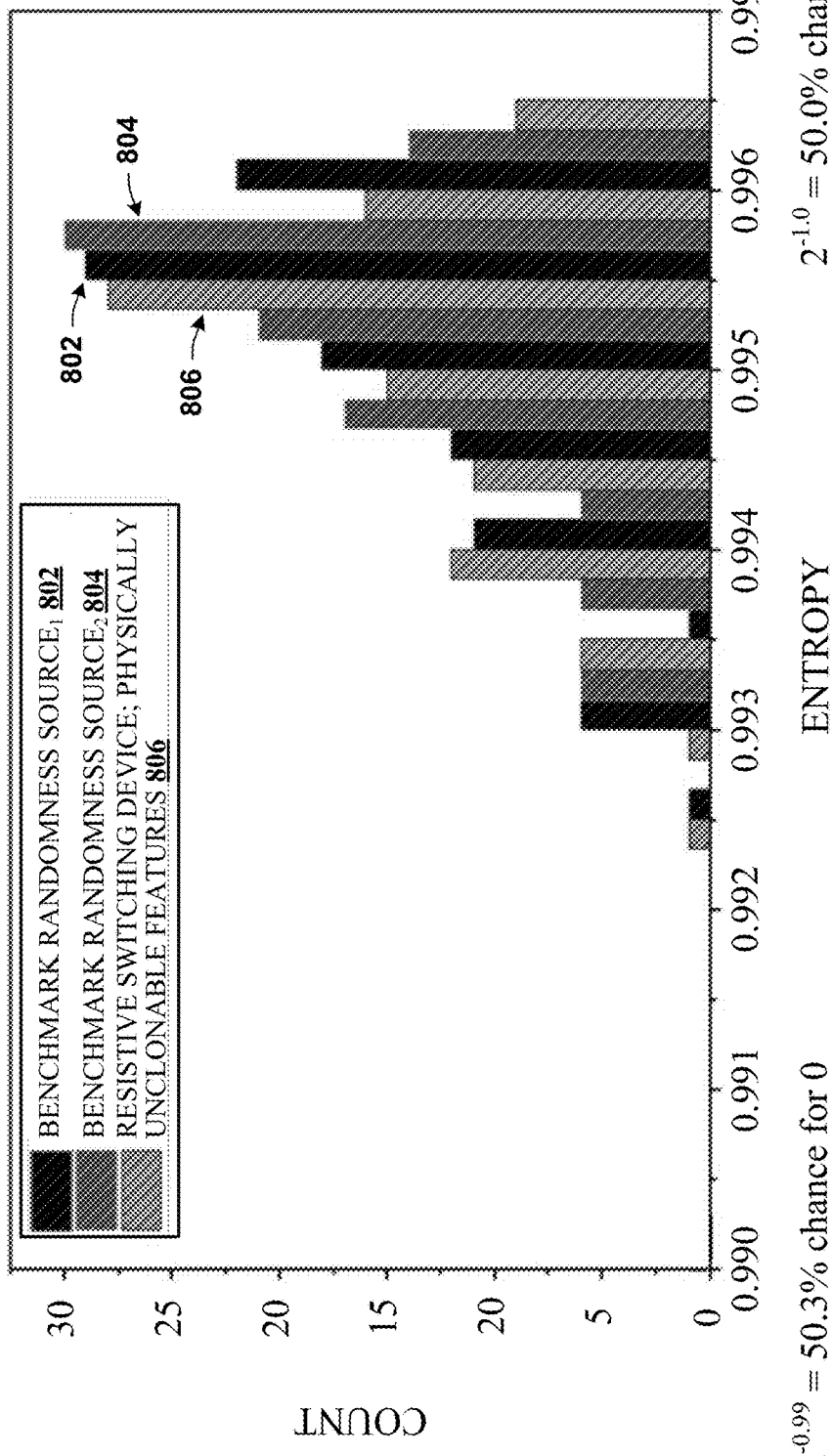
FIG. 8 depicts an example chart of an entropy metric for identifier data generated from RS devices compared with existing benchmarks.

In addition to the foregoing, disclosed resistive switching devices have excellent properties for generating identifier data sequences. Such properties include high entropy, as illustrated in FIGS. 6 and 8, infra, for generating random or substantially random numbers, low BER, inherent difficulty in reverse engineering or illicit side-channel data access, and fast sensing times. For example, a bit sequence of 128 or 256 identifier bits (also referred to herein as physical unclonable feature (or PUF) bits) can be formed from 128 or 256 resistive switching devices (as described herein) or 128/256 groups of multiple such resistive switching devices (as described in differential identifier bit generation, herein). High randomness in generating identifier bits minimizes non-random patterns between bits (resistive switching devices/groups of such devices) of a sequence, mitigating or avoiding false rejection rates. In addition, high randomness enhances security margin by minimizing hamming distance values for multiple read operations of an identifier sequence on a single die (intra-HD; FIG. 5) and providing an ideal gaussian distribution of hamming distance values among multiple dies of resistive switching devices. This can increase a total number of semiconductor chips that can achieve distinct identifier sequences for a given sequence bit count, even with high security margin (e.g., defined by a number of distinct bits between each sequence utilized for identifying a single die).

In one or more embodiments, controller 160 can be operable to perform memory operations on array of RS devices 105. For instance, controller 160 can be operable to perform sensing operations pertaining to generating an identifier data bit from one (or a group of) resistive switching device(s) allocated to identifier devices 120, in an embodiment(s). Examples of sensing operations pertaining to generating an identifier bit can include: native current (of an un-programmed resistive switching device, also called leak current), native electrical resistance of a resistive switching device, detection of program events, detection of speed or timing of program events, a program voltage, a program current, an on-state (programmed) resistance, an erase voltage or current, a delay frequency, a parasitic resistance or capacitance, a program or erase minimum pulse width, and so forth, or suitable combinations of the foregoing, described throughout this specification. In other embodiments, controller 160 can be operable to perform a program operation(s) pertaining to generating an identifier data bit from one or more resistive switching devices allocated to identifier devices 120, in further embodiments. Examples of such program operations include: native program voltage, native program speed, native program current, and so forth. In still other embodiments, controller 160 can be configured to implement differential operations pertaining to generating an identifier bit from a plurality of resistive switching devices. Differential operations usable to generate an identifier bit according to aspects of the present disclosure can include: differential program speed, differential native program voltage, differential native (leak) current, differential native electrical resistance, differential on-state resistance, differential erase voltage or current, differential delay frequency, differential parasitic resistance or capacitance, a differential program or erase minimum pulse width, or the like, or a suitable combination of the foregoing (e.g., see FIGS. 9-12, infra).

In yet other embodiments, controller 160 can be operable to selectively implement one-time programmable operations on selected identifier devices 120 to render permanent an identifier bit sequence generated with a program event (e.g., native program voltage, native program speed, differential program speed, differential program voltage, etc.). In still additional embodiments, controller 160 can be operable to establish one or more threshold metric levels (e.g., current level(s), resistance level(s), program voltage level(s), program speed level(s), etc.) for defining identifier bit values (e.g., logic levels; a '0' bit and a '1' bit in the binary context) from sensing operations or program operations performed on identifier devices 120, as described herein. As an illustrative example, if an operational characteristic selected to generate identifier bit data is a native leak current, a current value threshold (or small range of values) (e.g., 500 nA, or any other suitable value or range) can be selected and resistive switching devices above the current value threshold can be allocated a '1' identifier bit value and devices below the current value threshold can be allocated a '0' identifier bit value. In other embodiments, a range of threshold values with a lower threshold and an upper threshold (e.g., a lower threshold of 400 nA and an upper threshold of 600 nA, or any other suitable threshold value or range of values) can be utilized. Devices with native current below 400 nA can be allocated a '0' identifier bit value; devices with native current above 600 nA can be allocated a '1' identifier bit value, and devices between 400 nA and 600 nA can be discarded, in an embodiment. In an embodiment, further read operations can use a 500 nA threshold to regenerate the '0' bit values and '1' bit values. Using lower and higher initial threshold values can increase sensing margin and reduce bit error rates, according to embodiments of the present disclosure.

In the same or other embodiments, controller 160 can comprise counter 162 and memory 164. Counter 162 can be configured to count programming events (e.g., associated with identifier devices 120, devices used for generating a random number, etc.), for example, programming events associated with differential programming of one or more sets or groups of resistive switching memory devices, as discussed herein. Memory 164 can be configured to store and/or update one or more counts maintained by counter 162 for associated resistive switching memory devices (e.g., those of identifier devices 120, devices used for generating a random number, etc.). In various such embodiments, the count(s) of programming events for one or more sets/groups of resistive switching memory devices counted by counter 162 and stored/updated by memory 164 can be compared by controller 160 to associated threshold(s) (e.g., stored in memory 164, etc.). When the count(s) meet or exceed the threshold(s) (e.g., depending on the nature of the comparison, etc.), controller 160 can take an associated action (e.g., terminating a differential programming event for that set/group of resistive switching memory devices, etc.).

In alternative or additional embodiments, controller 160 can maintain a program count for a subset of resistive switching devices of array of RS devices 105 in memory 164. Groups of RS devices having similar program count can be formed by controller 160 as well, and such group association of respective RS devices 105 can also be stored in memory 164. Controller 160 can be configured to specify different threshold program counts, ranges of program counts or the like to generate such a group and associate RS devices 105 with a group. As non-limiting illustrative examples, a group can include RS devices 105 having zero program count (e.g., never having been programmed, or native/virgin devices), a second group can include RS devices having a program count of 1-5 program events, a third group can include RS devices having a program count of 6-10 program events, a fourth group can include RS devices having a program count of 11-25 program events, or any other suitable example program count grouping. RS devices associated with a particular group, as well as their respective program counts, can be stored by controller 160 in memory 164. Additionally, controller 160 can update the program count in response to counter 162 determining a new program event for an RS device(s), and update a group association stored in memory 164 as appropriate. To continue the above example, if a RS device having a program event count of 10 and associated with the third group experiences an 11th program event (e.g., in response to a RNG program operation), counter 162 can update the program event count of the RS device, and controller can remove the association of the RS device with 11 program events from the third group and associate this RS device with the fourth group instead.

By repurposing previously programmed RS devices for random number generation, controller 160 can provide a random number generation function utilizing array of RS devices 105 that leverages the stochastic characteristics of resistive switching memory cells as described herein. Moreover, controller 160 can mitigate or avoid correlation effects among RS devices that result from programming and erasing the RS devices. For instance, by generating random number sequences from groups of RS devices having the same or similar program count (e.g., a program count within a threshold number of program events per RS device of a particular group of RS devices), correlation effects resulting from large programming events can be at least partially controlled to maximize the randomness of a group of RS devices with a given program count. This allows discloses array of RS devices 105 to generate far more random number sequences than a number of RS devices in the array, while mitigating the above-mentioned correlation effects that result from many program/erase events.

It should be appreciated that a suitable threshold or set of thresholds can be established for other resistive switching device operational characteristics selected for generating identifier bits information. As another (non-limited) illustrative example, a logic level 0 can be associated with a program voltage of 2 volts or higher and a logic level 1 associated with a program voltage of 1.8 volts or below. As stated previously, other suitable thresholds can be used to define logic level values for identifier bits as disclosed herein. In some embodiments, when a large number of resistive switching devices are sensed as part of generating identifier bits, a threshold voltage, current, pulse width etc., can be selected such that approximately half of the devices become associated with a logic level 0 and another half become associated with a logic level 1. In some embodiments, threshold settings can be performed manually by way of controller 160; in other embodiments default threshold settings can be set upon initializing a semiconductor chip.

In further embodiments, an operational characteristic or program event utilized to generate an identifier bit sequence can be selected to have the same or substantially the same measurement over time, over many read cycles and at a range of temperatures common to semiconductor chips. This leads to very low bit error rate for disclosed identifier bit sequences (e.g., see FIG. 7, infra). As an illustrative example, a native leak current (or other physical unclonable characteristic) for a resistive switching device measured for the first time on day 1 at room temperature can measure the same or substantially the same (e.g., relative to a constant native leak current threshold) five years later, at 100 degrees C. after a million read operations. Values of the resistance switching device can be determined upon demand by controller 160. As another illustrative example, to determine an electrical resistance of a resistive switching device, a current source can be applied to the resistive switching device, a voltage drop measured and resistance calculated. Other techniques for measuring or determining physical characteristics of resistive switching devices known in the art or reasonably conveyed to one of ordinary skill in the art are considered within the scope of the present disclosure.

In addition to the foregoing, controller 160 can be configured to define an arrangement or ordering of resistive switching devices (or groups of resistive switching devices) to create a multi-bit sequence of identifier bits. As one illustrative example, resistive switching devices 0:7 can be read and assigned to bits 0:7 of a bit sequence. In other embodiments, the bit sequence need not be derived from resistive switching devices arrayed in a particular order. As an example, from an ordinal line of resistive switching devices, devices 15, 90, 7, 21, 50, 2, 37, 19 can be read and respectively assigned to bits 0:7 of an output bit string. The bit string can be of any selected length. For instance, bit strings of 64 bits, 256 bits, 1024 bits, 64 kbits, or any other suitable subset of identifier devices 120 up to all of identifier devices 120 (which can include all of array of RS devices 105 in at least some embodiments) may be employed for a bit string. As another non-limiting illustration, for a 256-bit identifier sequence, controller 160 can define an ordering of identifier devices 120/groups of identifier devices 120 to correspond with a sequence of 256 bits. Identifier bit values (e.g., logic levels, . . . ) generated from the identifier devices 120/groups of identifier devices 120 can then be ordered by controller 160 consistent with the device(s) ordering to thereby create the 256-bit identifier sequence. As a specific illustration: where a row of 256 resistive switching devices in an array is selected for generating an identifier sequence, identifier bit values of the 256 resistive switching devices can be arranged in the order the resistive switching devices are physically situated in the row; however, this is an illustrative example only and any other suitable arrangement or ordering can be implemented by controller 160 as an alternative or in addition.

As is evident from the disclosure as a whole, any suitable number of bits can be allocated to identifier bits, and thus controller 160 can be operable to determine which identifier bits from identifier devices 120 contribute to identifier data: 64 bits, 1 kbits, 64 kbits or any other suitable subset of array of RS devices 105 up to and including all of array of RS devices 105. In one or more embodiments, controller 160 can implement methods 1300 and 1700 of FIGS. 13 and 17 on array of RS devices 105.

In one or more additional embodiments, controller 160 can be operable to store data in resistive switching devices 110 or OTP devices 130. Controller 160 can receive an input data word from input(s) 140 to be stored, as an example. In some embodiments, controller 160 can combine the input data word with an identifier data sequence stored at/generated by identifier device 120 to generate an output data word. This output data word can be stored in resistive switching devices 110. The input word can optionally be deleted. Subsequently, to recreate the input data, the output data word stored in resistive switching devices 110 can be combined with the identifier data sequence (optionally computed on-the-fly by controller 160), and the recreated input data word can be output via output(s) 150. In various embodiments, such an input data word can be a password, a document, a cryptographic key, or any other suitable data to be stored securely. Initial randomness tests using various embodiments for generating identifier data disclosed herein have been successful. In one randomness test, NIST SP800-22, all 15 sub-tests were passed for embodiments based upon application of voltage or current driving signals to identifier devices 120. Likewise, another randomness test, NIST SP800-90B, all sub-tests were passed for similar embodiments based upon application of voltage or current driving signals. In the randomness tests, 100 bitstreams were tested, utilizing 1 Mb/bitstream and a total of 300 Mb using NIST SP 800-90B, passing all sub-tests for randomness.

Figure 2:
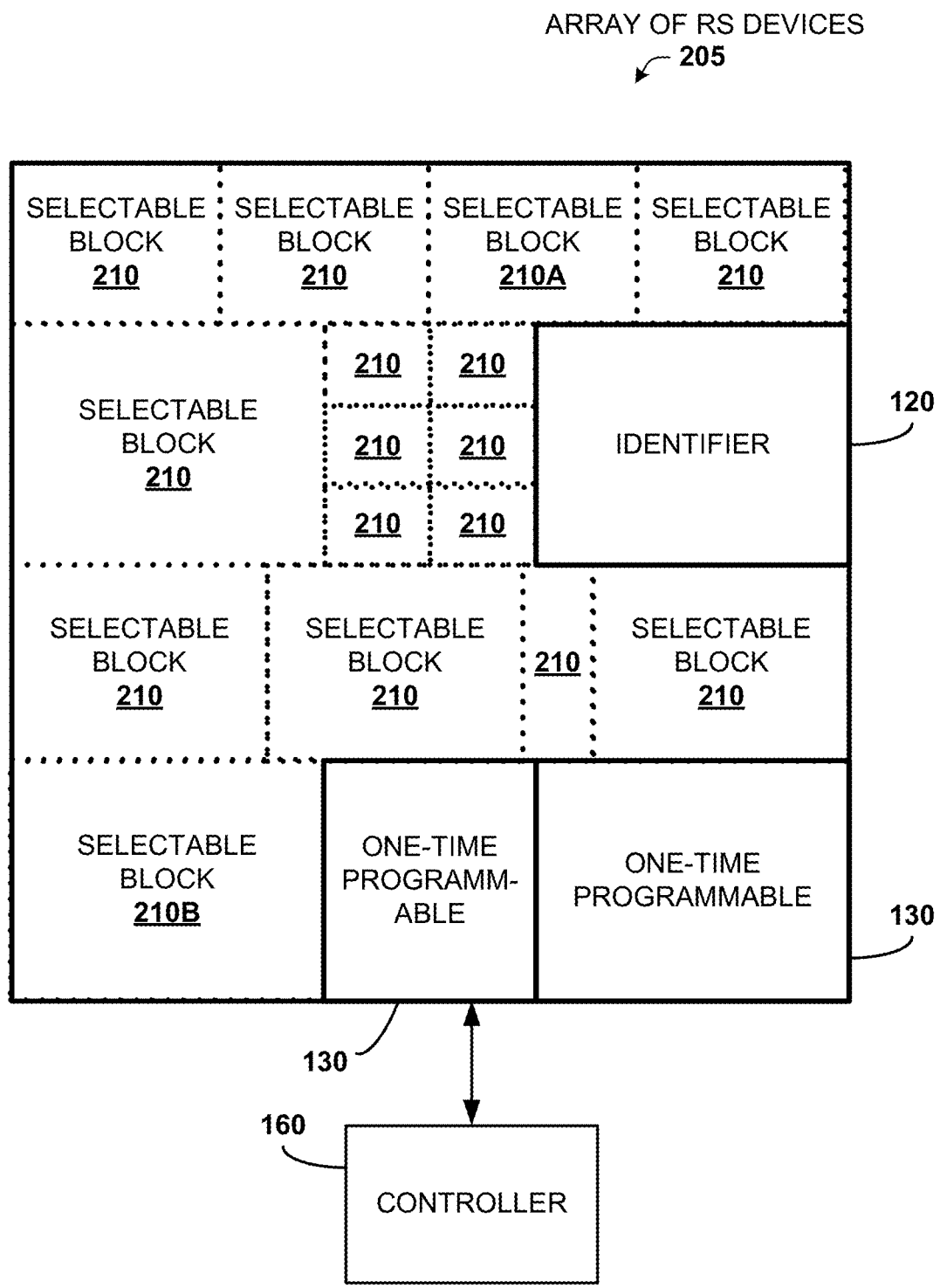
FIG. 2 depicts a diagram of example subsets of an array of RS devices that can be externally controlled by the electronic device of FIG. 1, in an embodiment.

FIG. 2 illustrates a block diagram of an example array(s) of resistive switching (RS) devices 205 according to alternative or additional embodiments of the present disclosure. In an embodiment, array of RS devices 205 can be substantially similar to array(s) of memory 105 described above. However, array of RS devices 205 is not limited to the description given above, and in some embodiments can include other features or functions in addition to or instead of those described above.

Array of RS devices 205 can be partitioned into subsets illustrated as selectable blocks 210. Although various sizes and positions of selectable blocks 210 are illustrated in the example array of RS devices 205 depicted in FIG. 2, it is to be understood that these sizes and positions are illustrative only. Moreover, the term "block" is not intended to limit the number, position, layout or spatial orientation of groups of resistive switching devices that may be allocated to a selectable block 210. Rather, the term "block" is merely intended to represent a selectable grouping of any suitable subset of resistive switching devices within array of RS devices 205, subject only to physical limitations of circuitry layout (if any) and operational access to a group of resistive switching devices that may be instituted upon manufacture of a semiconductor die containing array of RS devices 205. However, where two-terminal resistive switching devices that are bit addressable are employed within array of RS devices 205, no such limitation need apply, and any suitable selection, grouping, concatenation, etc., of resistive switching devices can be defined as a selectable block 210 by way of controller 160 in such embodiments. For example, in at least one embodiment, non-contiguous groups of resistive switching devices can be defined as a selectable block 210 (e.g., selectable block 210A and selectable block 210B can be defined as a single selectable block 210AB), and in another example a group of resistive switching devices defining a non-rectangular or even a non-regularly-shaped area (e.g., a non-shape area) can be defined as a selectable block(s) 210 in still other embodiments. Suitable combinations of the foregoing can be implemented in yet other embodiments.

Controller 160 can receive input (e.g., by way of input(s) 140 of FIG. 1, supra or via another command path—not depicted) of a selection of resistive switching devices to assign as a group. The selection can include any suitable number of resistive switching devices, including regular or non-regular shaped groupings, non-shaped groupings, contiguous and non-contiguous resistive switching devices, or the like, or a suitable combination of the foregoing. Thus, although FIG. 2 illustrates a rectangular block of identifier devices 120 within array of RS devices 205, it should be understood that different subsets of array of RS devices 205 can be defined selected as identifier devices 120 instead. Similarly, controller 160 can receive input of a selection of one-time programmable (OTP) devices 130. Although the groupings of OTP devices 130 are depicted within a rectangular footprint, similar to the identifier devices 120, non-regular, non-shape, non-contiguous groupings of OTP devices 130 can be selected as well, and defined as OTP devices 130 by controller 160. Controller 160 can also receive selections of groupings of resistive switching memory devices (e.g., resistive switching devices 110 of FIG. 1, supra) for one or more of selectable blocks 210, or where included upon manufacture, selections of groupings of volatile resistive switching devices for one or more of selectable blocks 210.

In various embodiments, controller 160 can facilitate defining selectable blocks 210 during pre-operation setup routines, post-manufacture. In some embodiments, controller 160 can facilitate defining or re-defining selectable blocks following operation of array of RS devices 205. For instance, pre-operation groupings of devices as identifier devices 120, OTP devices 130, or resistive switching devices 110 can be modified during operational life of a chip or electronic device containing array of RS devices 205, in one or more embodiments, and where permitted by physical constraints of the resistive switching devices employed for array of RS devices 205. In general, devices programmed to OTP operation to store data as OTP data usually cannot be erased and thus cannot be re-purposed to a non-OTP operation. However, this is subject to technology capabilities of resistive switching devices employed for array of RS devices 205; for instance, where an OTP device can be re-purposed following OTP programming, such rededication can be effected by controller 160 in at least one embodiment. Where physical limitations permit, devices can be re-defined as identifier devices 120, OTP devices 130 and resistive switching devices 110 utilizing selection commands at controller 160 to re-define subsets of array of RS devices 205 for switching, memory, identifier or OTP operation, as disclosed herein, known in the art or reasonably conveyed to one of ordinary skill in the art by way of the context provided herein.

Embodiments in which controller 160 facilitate the definition of a user-selected subset of array of RS devices 205 for identifier devices 120 further enhances security of an identifier sequence generated by the identifier devices 120, making illicit access to such identifier sequence far more difficult. This is because a fixed set of bits within array of RS devices 205 for generating identifier data adds no additional ambiguity to the physical location where the identifier data is contained (or generated). As a result, a hacker intending to illicitly acquire the identifier data could target the precise portion of array of RS devices 205 for illicit side-channel read operations, such as high intensity microscopy (e.g., using high-magnification electromagnetic technology-whether visible, infrared or UV—to image the physical nature of identifier bits to see whether they are in a programmed or unprogrammed state). Compromising security of a chip need not even require the chip itself to succeed; some hacking operations merely require the identifier data in order to pass off an illicit chip as the chip associated with the identifier data. In this case, the hacker does not even care if portions of array of RS devices 205 are physically destroyed in the process of side-channel access (or even if most of the chip is destroyed); as long as the identifier data is accurately extracted, the hack succeeds. In contrast, when the portion of the resistive switching devices allocated to identifier devices 120 is unknown, hacking techniques cannot target the precise subset of bits that contain the identifier data. Thus, even having a manufacturer's layout of array of RS devices 205 as-fabricated is insufficient to determine which bits contain the identifier data; even the manufacturer of the chip itself will not know this information. Moreover destroying a few bits of array of RS devices 205 can effectively destroy the identifier data if those destroyed bits contain a portion of the identifier data, effectively foiling the hack attempt. Accordingly, providing controller 160 with the capacity to export selection of identifier bits 120 post-fabrication, and particularly allowing selection of different sizes of identifier bits, different locations of identifier bits within array of RS devices 205, non-contiguous groups of identifier bits and even irregular shaped or non-shape groupings of identifier bits significantly compounds the difficulty associated with illicit access of identifier data generated by array of RS devices 205 as described herein.

Figure 3:
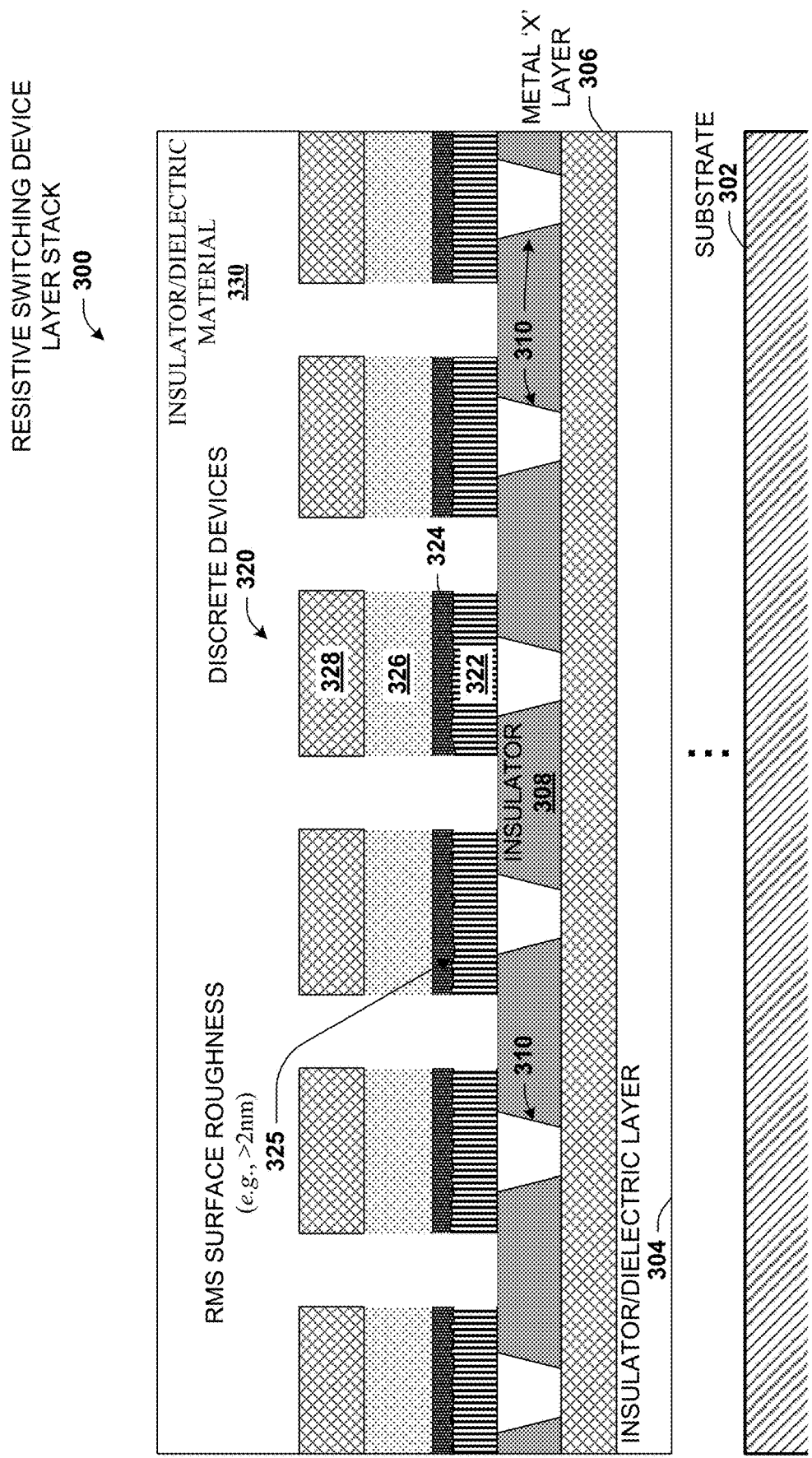
FIG. 3 illustrates a block diagram of a sample RS device layer stack and surface roughness of layers of the stack, in further disclosed embodiments.

FIG. 3 illustrates a block diagram of an example resistive switching device layer stack 300 according to further embodiments of the present disclosure. Note that device layer stack 300 and elements depicted therein (as well as other integrated circuit device drawings included herein) are not drawn to scale and rather are representative illustrations only. Device layer stack 300 includes a substrate 302. Substrate 302 can provide a foundation upon which integrated circuit fabrication processes can be implemented to form physical components of devices included within device layer stack 300. In an embodiment, substrate 302 can be a silicon (Si) or silicon oxygen material (e.g., $SiO_2$, ...), but is not limited thereto and in other embodiments can comprise any suitable substrate material.

Various embodiments of the present disclosure can optionally provide one or more layers fabricated on or above substrate 302, that are not depicted in FIG. 3. Such layers can include layers of integrated circuit devices such as: electrical devices, mechanical devices, electro-mechanical devices, and so forth. In an embodiment(s), such devices can be formed as part of front-end-of-line fabrication techniques, which can include fabrication techniques for forming devices within or at least in part within substrate 302, although the subject disclosure is not limited to such embodiment(s). Additionally, one or more layers overlying substrate 302 can be formed by back-end-of-line fabrication techniques in further embodiments. Such layer(s) can include metal layers underlying insulator/dielectric layer 304 (e.g., a metal x-1 layer, x-2 layer ... x-n layer, where n is a suitable integer), a dielectric layer(s), or the like, or suitable combinations of the foregoing. In an embodiment, one or more additional substrates similar to substrate 302 and optionally containing an integrated circuit device(s) or layer(s) formed on the additional substrate(s) can be bonded to substrate 302 and underlie insulator/dielectric layer 304, according to multi-die bonding techniques known in the art.

As illustrated by FIG. 3, insulator/dielectric layer 304 is positioned overlying substrate 302 and overlying any optional layer(s) formed between substrate 302 and insulator/dielectric layer 304. A metal layer, illustrated as metal 'x' layer 306 is provided over insulator/dielectric layer 304. X can be a suitable integer greater than zero. In an embodiment, metal 'x' layer 306 can be a back-end-of-line metal layer, but the subject disclosure is not limited to this embodiment.

An insulator 308 is formed overlying metal 'x' layer 306 containing conductive electrodes 310 (or conductive plugs) formed at spatial intervals therein. Overlying conductive electrodes 310 are respective discrete devices 320, such as resistive switching devices (e.g., resistive switching memory device, volatile resistive switching device, or a combination of a resistive switching memory device and a volatile resistive switching device). A bottom (electrically) conductive layer 322 of discrete devices 320 is in electrical contact (and physical contact, in some embodiments) with respective top surfaces of conductive electrodes 310 and with respective portions of a top surface of insulator 308. In some embodiments, one or more additional layers can be positioned between insulator 308 and bottom conductive layer 322, such as an adhesion layer(s), a diffusion barrier layer(s), a seed layer(s), an ion conductor layer(s), or the like, or a suitable combination of the foregoing.

A resistive switching layer 324 is formed overlying (and optionally in physical contact with) conductive layer 322. Resistive switching layer 324 is depicted with a native surface roughness 325 formed into a bottom surface of resistive switching layer 324 at a boundary of conductive electrode 310. Native surface roughness 325 can be defined by grain boundaries of atomic/molecular particles forming a (top) surface of conductive electrode 310, a (bottom) surface of resistive switching layer 324 or a combination of the foregoing. Atomic/molecular particles or groups of such particles (also referred to as atomic/molecular "grains") can form irregular surface structures in surfaces of resistive switching layer 324. In an embodiment, distribution of particles as-fabricated can cause the surface(s) of resistive switching layer 324 to have a RMS surface roughness greater than >0.2 nm (e.g., see FIG. 4A, infra). Although not depicted in FIG. 3 (though see FIGS. 4B and 4C, infra), a top surface of resistive switching layer 324 can also have a RMS surface roughness greater than 0.2 nm. The top and bottom surfaces can have a maximum RMS surface roughness no greater than 10 nm, in an embodiment. In still further embodiments, top and bottom surfaces of resistive switching layer 324 can have RMS surface roughness within a range of between 0.2 nm and 10 nm or any suitable value or range there between (e.g., 0.2 nm to 5 nm; 0.5 nm to 5 nm; 0.75 nm to 3 nm, and so forth). This can result in variations in thickness (measured from a top surface to a bottom surface) of the resistive switching layer 324 throughout its volume. Moreover, the position, orientation, size and distribution of grain boundaries within resistive switching layer 324 is generally a stochastic or substantially stochastic process, resulting in non-correlated surface roughness for switching layer surfaces of respective discrete devices 320 (e.g., see FIG. 4, infra).

A particle donor layer 326 is provided overlying resistive switching layer 324. Particle donor layer 326 can comprise conductive particles that are diffusive within resistive switching layer 324 and can also be referred to as a metal layer, an active metal layer or the like throughout this disclosure. Particle donor layer 326 can be comprised of suitable material for an active metal layer or particle donor layer as disclosed herein (or as known in the art or reasonably conveyed to one of ordinary skill in the art by way of the context provided herein). Further, a conductive layer 328 can be provided overlying metal layer 326. In an embodiment, conductive layer 328 can be a metal "x+1" layer as part of backend-of-line metal wiring in conjunction with metal 'x' layer 306. However, conductive layer 328 is not so limited and can be a doped silicon layer, doped silicon-germanium layer, a metal-containing layer (e.g., a conductive metal compound, alloy, mixture or the like) or other suitable electrically conductive layer that is provided between backend-of-line metal wiring of an integrated circuit device. In at least one embodiment, one or more layer(s) can be provided between particle donor layer 326 and conductive layer 328, such as a conductive capping layer (e.g., providing electrical continuity between particle donor layer 326 and conductive layer 328), an adhesion layer, a diffusion barrier layer, an etch stop layer, an ion conductor layer, and so forth. An insulator/dielectric material 330 overlies and surrounds discrete devices 320, providing electrical isolation between discrete devices 320 and layer overlying discrete devices (not depicted).

Figure 4:
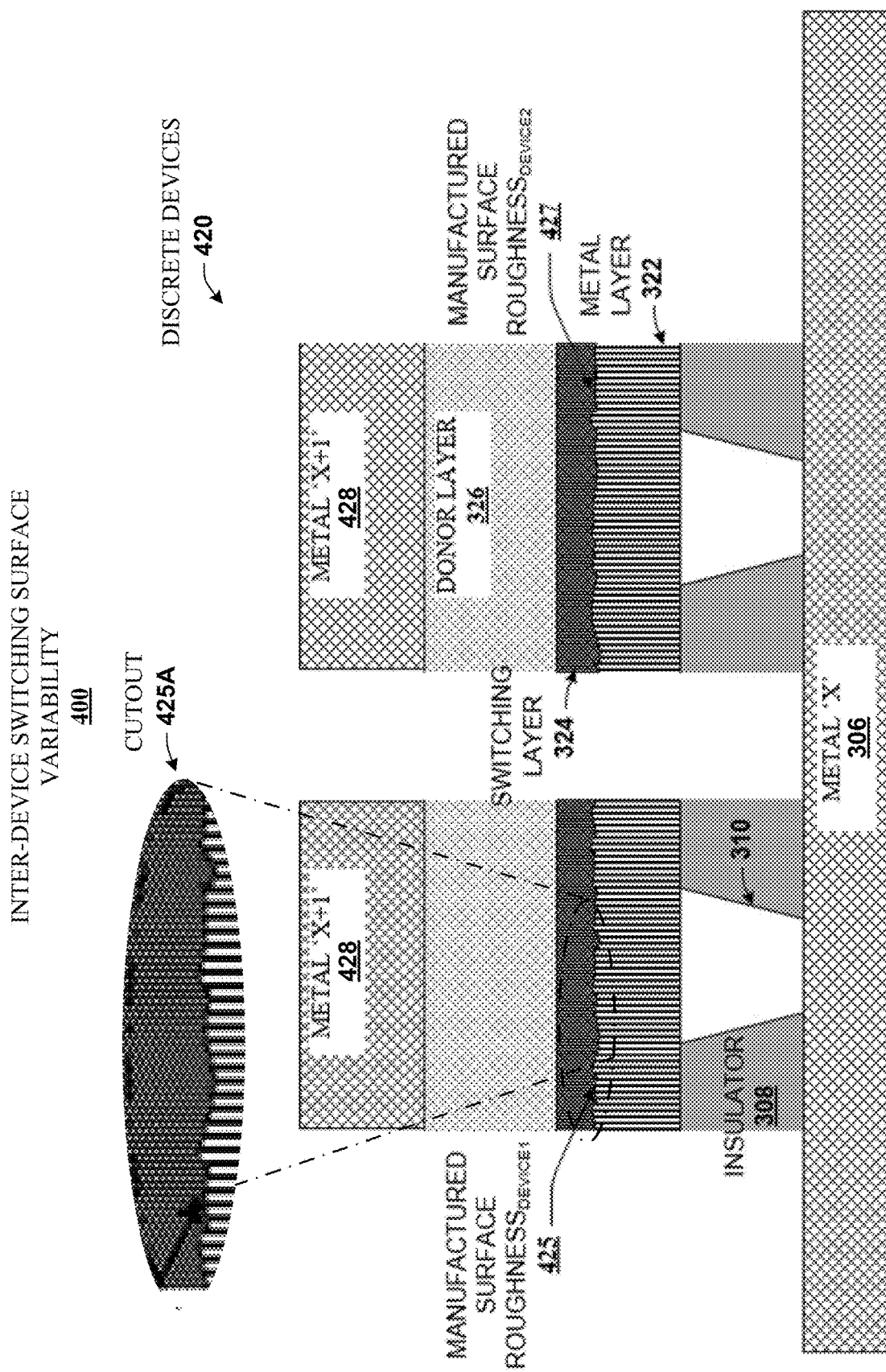
FIG. 4 depicts a block diagram of example adjacent RS devices of an array and variations in layer surface roughness, in still other embodiments.

FIG. 4 illustrates a block diagram of inter-device switching surface variability 400 according to embodiments of the present disclosure. A pair of discrete devices 420 formed as part of an integrated circuit device are illustrated. In an embodiment(s), discrete devices 420 can be substantially similar to discrete devices 320 of FIG. 3, but the subject disclosure is not limited to this embodiment(s). For instance, discrete devices 420 can be formed between adjacent back-end-of-line metal wires metal 'x' 306 and metal 'x+1' 428 of an integrated circuit device. In an embodiment, metal wires 306, 428 can be formed of (or lined with—not depicted) a liner of a dense metal-containing material that is non-transparent to visible, infrared or ultraviolet electromagnetic spectra. Examples include Ti, Ta, W, Cu, Al, Fe, suitable alloys or mixtures of the foregoing, suitable nitrides or oxides of the foregoing, or the like or suitable combinations thereof. This arrangement helps to occlude discrete devices 420 from view by illicit microscopy technology to improperly read bit states of discrete devices 420 (e.g., see FIGS. 4B and 4C, infra).

Figure 4A:
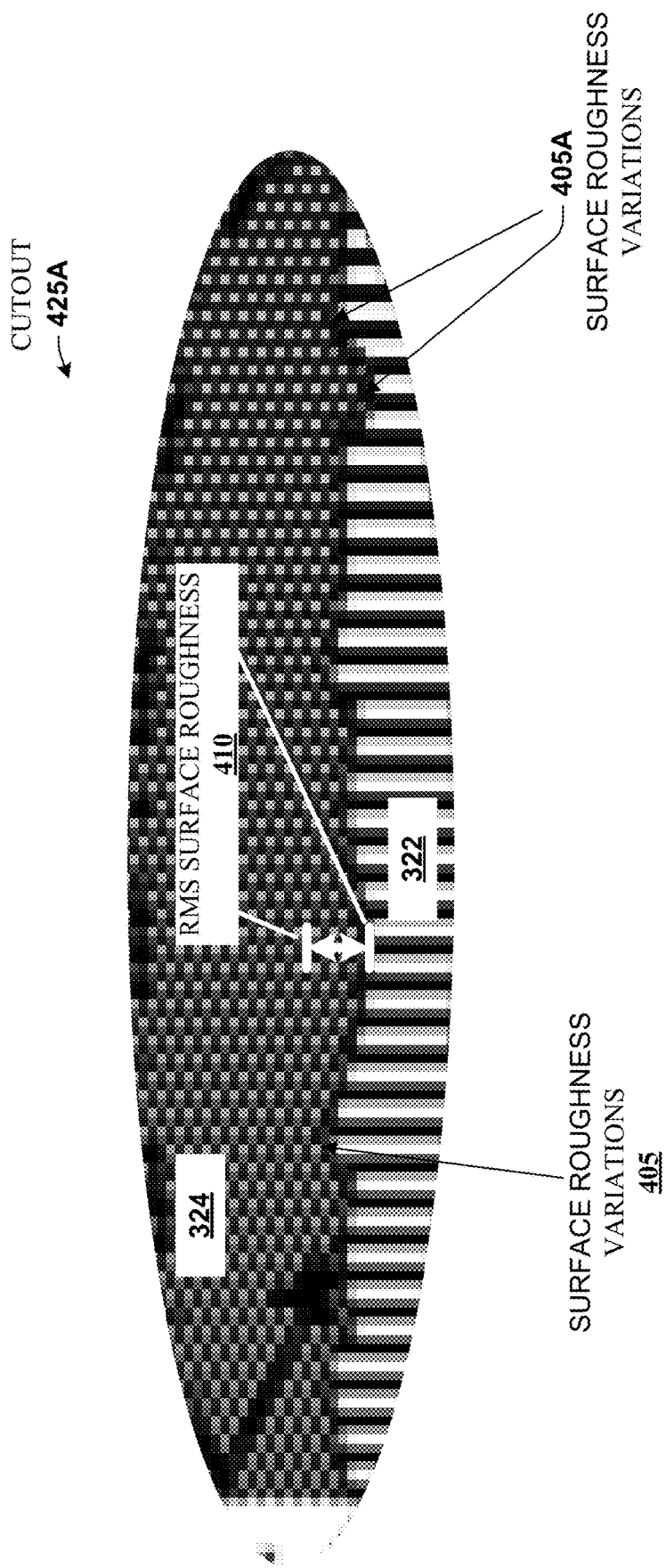
FIG. 4A illustrates a close-up of example surface roughness between layers of a RS device in still further embodiments.

Discrete devices 420 include respective switching layers 324 having respective manufactured surface roughness, including surface roughness$_{device1}$ 425 and surface roughness$_{device2}$ 427. Cutout 425A illustrates a close-up view of manufactured surface roughness$_{device1}$ 425 (see also FIG. 4A, depicting individual surface roughness variations 405A in a boundary of conductive material 322 and switching layer 324 as well as an example range of RMS surface roughness 410). As described herein, the surface roughness can have a RMS value >0.2 nm in an embodiment(s). In further embodiments the surface roughness can have a maximum RMS value no more than 10.0 nm. However, because the surface roughness is formed from stochastic or substantially stochastic processes, inherent variations in surface roughness and associated thickness of switching layer 324 among devices can lead to stochastic variance in operational characteristics among discrete devices, including: respective program voltages, respective native resistance, respective programmed resistance (electrical resistance in a programmed state), respective programmed current, respective erase current (current flow in an un-programmed state, or leak current), respective erase voltage, current, field strength, field polarity, or the like or a suitable combination of the foregoing. In some embodiments, one or more of these characteristics will have little to no cross-correlation among discrete devices 420, and little or no cross-correlation to spatial position on a die or wafer. Deliberate variance during fabrication can lead to cross-correlation being quite small: within a range of about −0.2 to about 0.2, a range of about −0.1 to about 0.1, a range of about −0.02 to about 0.02, a range of about −0.01 to about 0.01, and in some embodiments a range of about −0.003 to about 0.003 (e.g., see FIG. 9, infra).

In one or more embodiments, thickness of switching layer 324 varies spatially with RMS surface roughness (e.g., >0.2 nm) on bottom and top surfaces of switching layer 324. Processes for depositing switching layer 324 can vary, by design, based on specifying wider ranges of manufacturing parameters compared to conventional ranges of manufacturing parameters for depositing a switching layer, in an embodiment. In one or more embodiments, a nominal thickness for switching layer 324 can be within a range of 10 angstrom (Å) to 20 Å, 15 Å to 35 Å, 10 Å to 40 Å, or any suitable value or range there between. In various embodiments, larger variation in surface roughness can be achieved by adjusting temperature of deposition, time of deposition, purity of reagent chemicals, flow rate(s) of reagent chemicals, deposition power, or the like, or suitable combinations of the foregoing. In an embodiment(s), a spatial thickness variation for switching layer 324 can be in a range from: 2% to 10%, 5% to 20%, 2% to 20%, or any suitable value or range there between.

Switching layer 324 thickness is one parameter that can impact various operational characteristics of discrete devices 420. Examples of such operational characteristics can include: volatility/non-volatility, on/off current ratio, switching time, read time, memory durability, program/erase cycle and the like. Based upon ranges of manufacturing tolerance at least some of these characteristics of resistive switching devices can have very low cross-correlation among resistive switching devices in an array, or switching devices on a die (intra-device), among dies in a wafer, or among wafers (inter-device). In some embodiments, for two resistive switching devices on a die, a cross-correlation of native (un-programmed) resistance, native (un-programmed) current, native program voltage, program resistance, erase voltage, or the like can be between −0.1 to 0.1 in some embodiments, or between −0.01 to −0.01 in further embodiments. As an example, native electrical resistance can be within a range of 100 kiloohm (kΩ) to 50 megaohm (MΩ), 100 kΩ to 100MΩ, or any suitable value or range there between.

FIGS. 4B and 4C illustrate example switching layers 324 of two resistive switching devices 320B and 320C. Switching layers 324 are representative only, however, as surface roughness are identical per device 320B, 320C for case of illustration only; as discussed above will not be the case for real devices. Rather, FIGS. 4B and 4C illustrate filaments of conductive particles (referred to hereinafter as conductive filaments 402B, 402C) formed within switching layers 324 of devices 320B and 320C. Because electrical conductivity through switching layers 324 can be defined primarily by electrical continuity (or at least electron tunneling-based continuity) between conductive filament 402B and conductive material 322, a resistance state of devices 320B, 320C can also primarily be defined by electrical continuity of a conductive filament. Conductive filament 402B represents an electrically continuous path between particle donor layer 326 and conductive layer 322 through switching layer 324 of device 320B, causing device 320B to be in a low resistance (or programmed) resistive state. In contrast, conductive filament 402C represents an electrically dis-continuous path between particle donor layer 326 and conductive layer 322 of device 320C, causing device 320C to be in a high resistance (or erased, or non-programmed) resistive state. In the example depicted by FIGS. 4B and 4C, these respective continuity states are determined by only a pair of conductive particles 404B and 404C. For conductive filament 402B, particles 404B complete continuity between conductive filament 402B and conductive material 322, whereas for conductive filament 402C, particles 404C do not complete continuity between conductive filament 402C and conductive material 322. The position of these two particles 404B, 404C in these examples therefore is determinative of the resistive state of devices 320B and 320C. These figures illustrate the difficulty of side-channel reading of filamentary-based resistive switching devices. Because only a few atomic/molecular particles may be needed to complete or break continuity, thereby causing one state or another state, illicit techniques to determine the resistance state, such as high-intensity microscopy, can be very difficult. This can be further exacerbated when devices 320B and 320C are formed between metal wiring layers (e.g., as depicted in FIGS. 3 and 4, supra) due to the density of metal materials typically employed for backend-of-line wiring structures. Accordingly, resistive switching devices disclosed herein can provide high native security for identifier data, that is resistant to illicit side-channel access techniques that other pseudo-random state devices, such as SRAM, are vulnerable to.

FIG. 5 illustrates an example graph of hamming distance (HD) distribution 500 for 100 megabits (Mb) of resistive switching devices, according to an embodiment. The graph plots normalized hamming distance on the x axis against population of resistive switching devices (again normalized) on the y axis. Hamming distance represents a minimum deviation between uniquely identifiable bit sequences (e.g., two sequences in which at least one bit of the respective sequences is different). The blue graph lists hamming distance of identifier sequence data generated by resistive switching device techniques disclosed herein, between different semiconductor dies. The gaussian or near-gaussian distribution illustrated in FIG. 5 centered on 0.5 hamming distance provides an excellent distribution without apparent overlap, indicating distinct sequences for each semiconductor die. The red line indicates intra-hamming devices for multiple reads of an identifier sequence on a single die. Ideal intra-HD for a single die is 0.0, which is the case when the data sequence is read identically every time, producing a bit error rate (BER) of zero. Existing structures utilized to generate identifier data such as SRAM have very high native bit error rates, resulting in intra-HD values significantly larger than 0.0. This decreases the security margin differentiating intra-HD from inter-HD, increasing the likelihood that a read error overlaps with an identifier sequence of another semiconductor die, destroying identifier uniqueness. For resistive switching devices, the intra-HD is effectively 0.0 providing excellent security margin and minimizing BER and maximizing identifier sequence uniqueness over many read cycles.

FIG. 6 depicts an example chart of spatial randomness 600 for identifier data generated from disclosed resistive switching devices according to further embodiments of the present disclosure. Spatial randomness is defined by the correlation function 620 as $R_{xx}(j)=1/N\Sigma_N x_i x_{i+j}$ where N is a number=256 of bits, $x_i$ is an $i^{th}$ bit and $x_{i+j}$ is an $i+j^{th}$ bit. As shown by the chart of correlation 600, correlation between adjacent bits is between −0.003 and 0.003, and largely between −0.002 and 0.002, indicating excellent non-correlation for the disclosed resistive switching devices.

Figure 7:
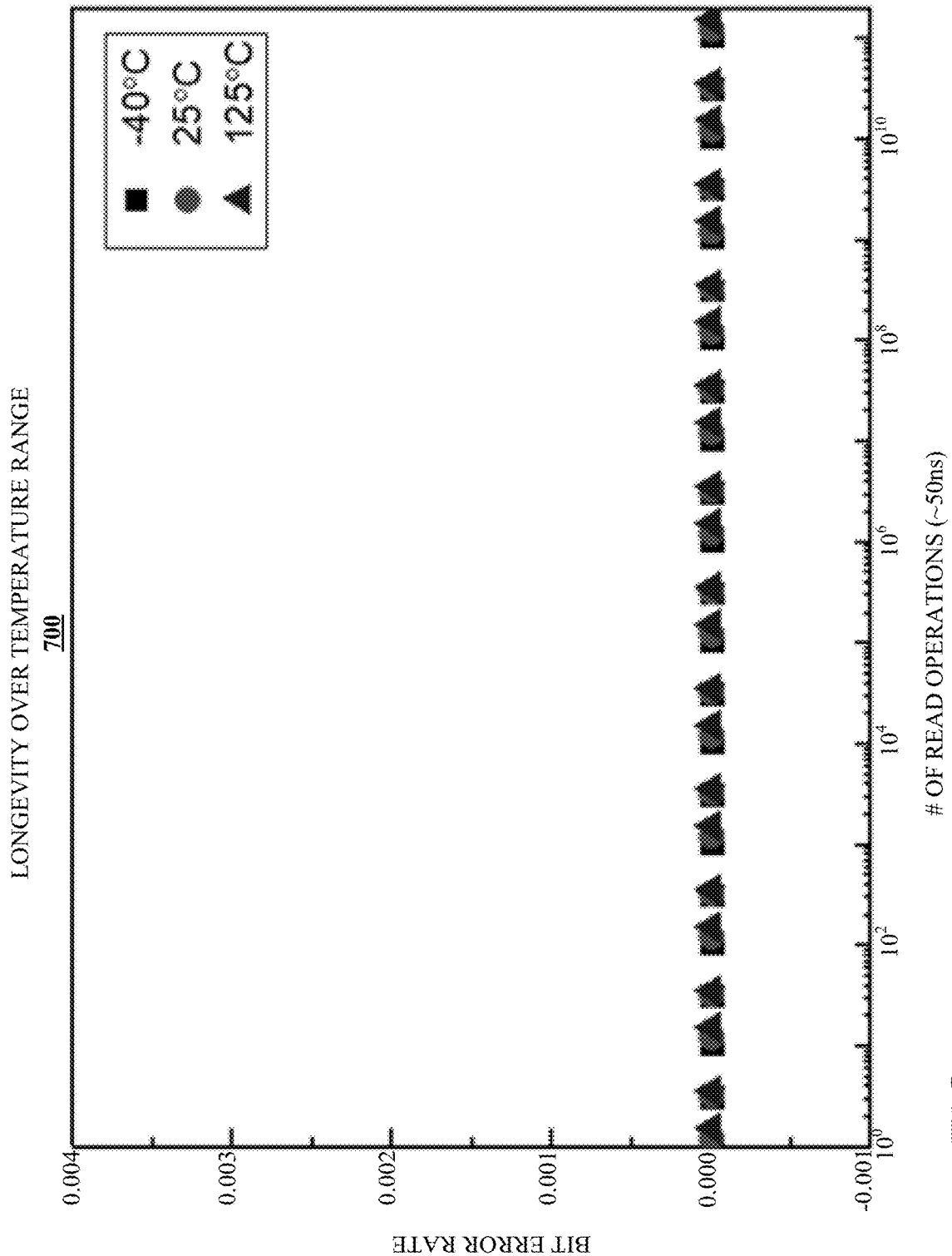
FIG. 7 illustrates an example graph of bit error rate over many read operations for different temperatures according to additional embodiments disclosed herein.

FIG. 7 illustrates an example graph of longevity 700 over temperature range for resistive switching device identifier data according to one or more embodiments of the present disclosure. The graph plots number of read operations on the x axis versus bit error rate on the y axis, for temperatures of −40 degrees Celsius, 25 degrees Celsius and 125 degrees Celsius. The BER is substantially zero even for 108 or more reads at all temperatures. In an embodiment, very high longevity as illustrated in FIG. 7 can be achieved in part by determining identifier bit values from a program-related event (e.g., median program voltage; differential program speed, or the like) that differentiates between resistive switching device bits on the basis of programmed or non-programmed. Following initial differentiation, bits defined as programmed can be one-time-programmed (e.g., utilizing a high voltage program pulse, a long program cycle time, a multi-pulse program cycle with high program peak and long pulse length, or the like) to render the programmed bits permanently programmed, non-erasable, one-time programmed, or the like. The one-time program process can significantly reduce bit loss of programmed devices, achieving very low bit error rates, such as depicted by FIG. 7.

FIG. 8 illustrates an example graph of randomness 800 for disclosed resistive switching devices in comparison with benchmark cryptographic-quality random number generators, according to further embodiments. The graph plots entropy for binary numbers: $2^{-x}$ on the x axis where x of 1.0 equals perfect entropy (50% chance for a 0 or 1 in any bit of a binary sequence). The y axis plots bit count. The light-shaded bars 806 represent identifier data derived from physically unclonable features of resistive switching devices for 100Mbits of identifier data, the heavily shaded bars 802 represent a first benchmark randomness source and the moderately shaded bard represent a second benchmark randomness source. The resistive switching device-generated data has comparable entropy to both cryptographic-quality random number generators, as illustrated by FIG. 8.

Figure 9:
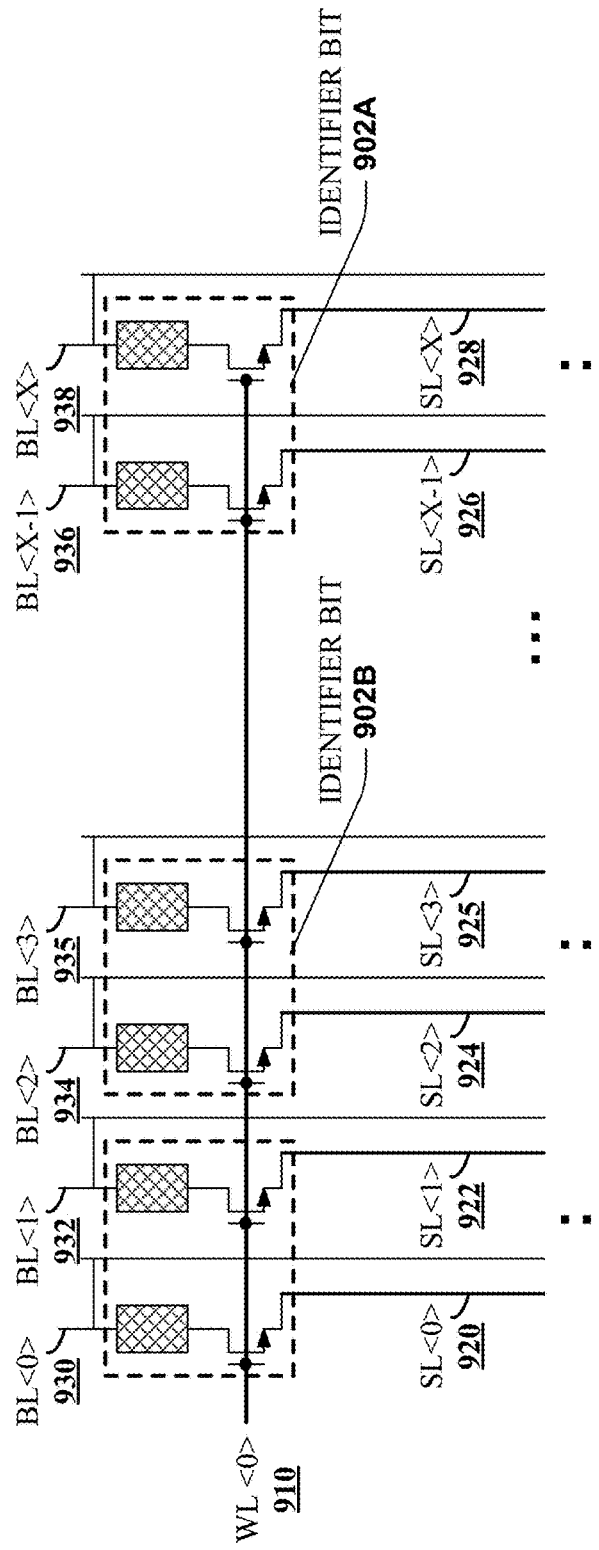
FIG. 9 illustrates an example schematic diagram of a grouping of RS devices facilitating differential processing for generating distinct identifier bit data, in an embodiment.
Figure 9:
Figure 9:
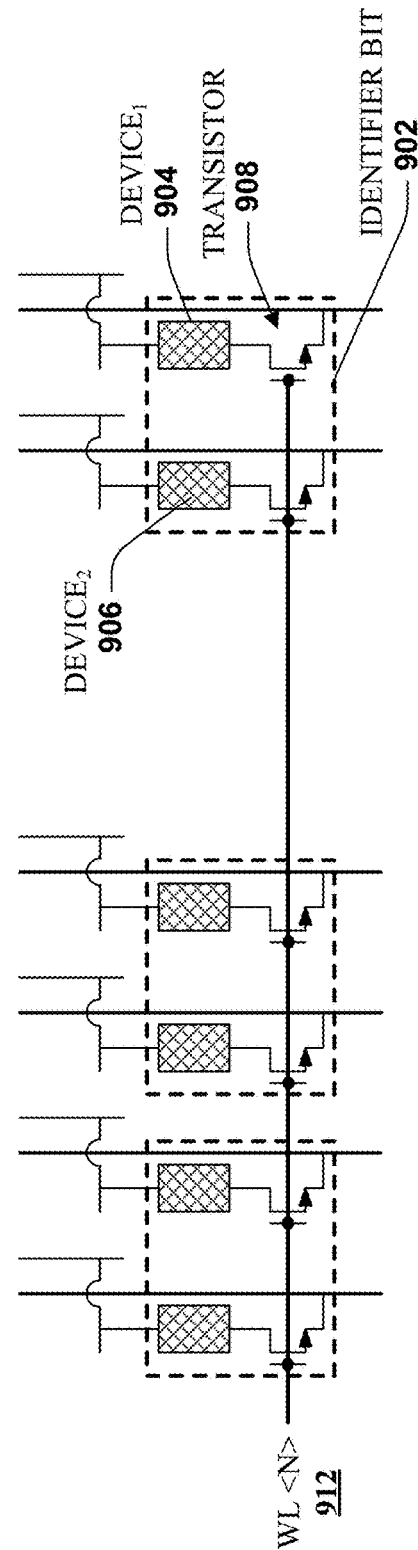

Referring now to FIG. 9, there is depicted an example schematic diagram of an array of resistive switching devices and an example differential grouping 900 of identifier bits 902, 902A, 902B (referred to collectively as identifier bits 902), according to one or more disclosed embodiments. In the differential grouping 900 of FIG. 9, pairs of resistive switching devices are allocated to a single identifier bit (e.g., by a controller, such as controller 160 of FIG. 1). Also as illustrated in the differential grouping 900 each pair of resistive switching devices grouped into a single identifier bit 902, 902A, 902B are adjacent resistive switching devices on a common wordline, such as wordline0 910 through wordlineN 912, where N is a suitable integer greater than 0. Thus, for instance, the bottom right identifier bit 902 includes resistive switching device1 904 and an adjacent resistive switching device2 906 on wordlineN 912. Each resistive switching device 904, 906 can be connected at one terminal to a bitline 938, 939 and at a second end to a sourceline 928, 928 by way of a respective transistor 908. In the schematic diagram of FIG. 9, wordlineN 912 activates or deactivates transistors 908 connected to resistive switching devices 904, 906, thereby connecting or disconnecting, respectively, the resistive switching devices 904, 906 from the sourcelines 928, 929. In other words, when wordlineN 912 has a high voltage and activates transistors 908, resistive switching devices 904, 906 are connected to sourcelines 928, 929 respectively. In contrast, when wordlineN 912 has a low voltage and deactivates transistors 908, resistive switching devices 904, 906 are disconnected from sourcelines 928, 929, respectively.

A bit value of each identifier bit 902, 902A, 902B can be determined from a selected differential characteristic of the resistive switching devices defined for each identifier bit 902, 902A, 902B. If a first resistive switching device (e.g., defined by controller 160) of the pair of resistive switching devices 904, 906 has a first threshold characteristic, identifier bit 902 can have a first binary value (e.g., a '0' value). In contrast, if the second resistive switching device (e.g., defined by controller 160) of the pair of resistive switching devices 904, 906 has the first threshold characteristic, identifier bit 902 can have a second binary value (e.g., a '1' value). Example differential characteristics can include: program speed (e.g., which device is the first device to become programmed in response to a program voltage determines whether identifier bit 902 is '0' or '1'), program voltage (e.g., device1 904 having a higher program voltage than device2 906 determines a '0', or vice versa determines a '1'), native current (e.g., device1 904 having higher native current than device2 906 determines a '0', or vice versa determines a '1'), native electrical resistance (e.g., device1 904 having higher native resistance than device2 906 determines a '0', or vice versa determines a '1'), or the like, or a suitable combination of the foregoing. In an embodiment, once a differential program-related event establishes a value of identifier bit 902, the device that was first to program (or that had higher or lower program voltage, as determined at controller 160) can be set to one-time programmable programming to enable the identifier bit to be re-read many, many times with little to no error rate.

In at least one embodiment, differential characteristics of resistive switching devices defined for each identifier bit 902, 902A, 902B can be utilized to generate multi-bit binary data for the identifier bits. In one embodiment, larger groups of resistive switching devices can be grouped into respective identifier bits 902 to achieve multi-bit binary values. For instance, four resistive switching devices can be grouped to identifier bit 902 to achieve a dual-bit identifier data (e.g., see FIGS. 11 and 12, infra). In another embodiment, however, a controller (e.g., controller 160) can instead establish multiple states for pairs of resistive switching devices 904, 906 to achieve multi-bit binary information. For instance, a threshold native current (or range(s) of native currents) can be established and native current values of pairs of resistive switching devices 904, 906 can be utilized to define four (or more) differential states, which can be correlated to dual-bit (or higher) binary data. As an example, four differential states can be defined to include: a zeroth state in which both devices 904, 906 have less than a threshold native current (e.g., 500 nA), a first state in which device 904 has less than the threshold native current and device 906 has more than the threshold native current, a second state in which device 906 has less than the threshold current and device 904 has more than the threshold current, and a third state in which both devices 904, 906 have more than the threshold current. Measuring native current of pairs of devices 904, 906 can therefore be utilized to generate a dual-bit binary value for identifier bit 902. As yet another example, multiple threshold current values can be defined relative to native current values of pairs of devices 904, 906 to achieve even high multi-bit numbers. For instance, two native current thresholds (500 nA, 550 nA) can define three native current states (a less than 500 nA current state; a between 500 nA and 550 nA current state; and a greater than 550 nA current state) for each of the pairs of devices 904, 906. Three native current states measured with respect to two resistive switching devices 904, 906 can produce 23 differential states, enabling the definition of tri-bit binary data for identifier bit 902, and so forth. In various embodiments, combinations of larger numbers of resistive switching devices 904, 906 and multiple measurement thresholds can be utilized to achieve larger numbers of differential states, where $2^{\#of\ differential\ states}$ defines the number of binary bits that can be correlated to a single identifier bit 902, 902A, 902B.

Figure 10:
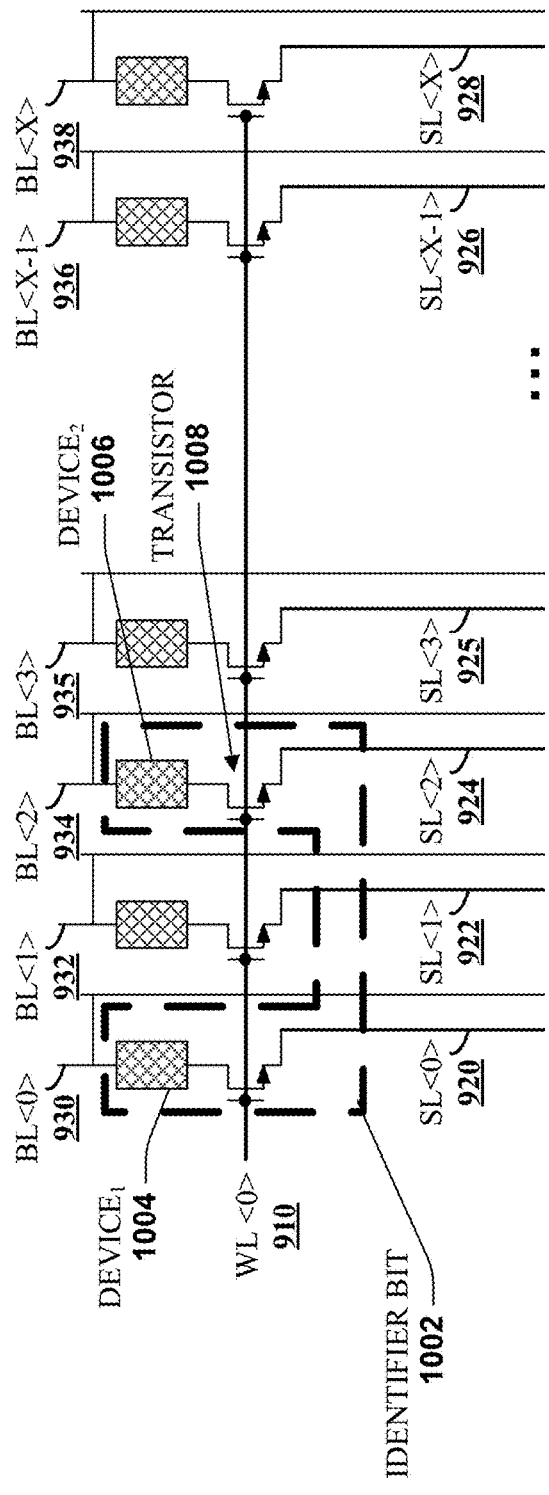
FIG. 10 depicts an example schematic diagram of groups of RS devices for differential processes to generate identifier bit data in further embodiments.
Figure 10:
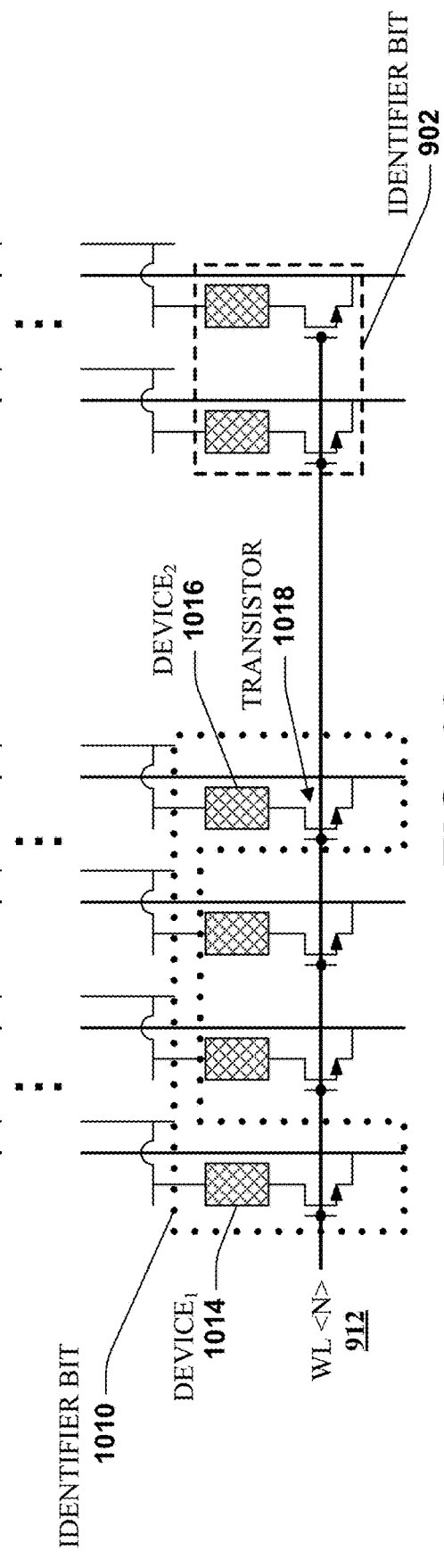

FIG. 10 illustrates a schematic diagram of an example array of resistive switching devices providing an alternative definition of differential grouping 1000 of identifier bits 902, 1002, 1010 according to alternative or additional embodiments of the present disclosure. Differential grouping 1000 can define multiple non-adjacent resistive switching devices on a wordline as a single identifier group. For instance, identifier bit 1002 includes device1 1004 on wordline0 910 and bitline 930 grouped with device2 1006 on wordline0 910 and bitline 932, which is not immediately adjacent to bitline 930. Likewise, identifier group 1010 includes device1 1014 on wordlineN 912 and bitline 930 grouped with device2 1016 also on wordlineN 912 but bitline 933, which is also not immediately adjacent to bitline 930. Identifier bits 1002 and 1010 as well as other suitable combinations can be defined by controller 160 of FIG. 1, infra. In addition to the foregoing, an identifier bit 902 having devices on a common wordline and on adjacent bitlines can also be grouped in the embodiment depicted by differential grouping 1000. Thus, differential grouping 1000 can mix groupings of devices on adjacent bitlines, with groupings of devices on non-adjacent bitlines in some disclosed embodiments.

FIG. 10A illustrates a schematic diagram of another example array of resistive switching devices providing a third definition of differential grouping 1050 of identifier bits 902, 1002, 1010 according to alternative or additional embodiments of the present disclosure. Differential grouping 1050 can define multiple adjacent or non-adjacent resistive switching devices on a wordline as a single identifier group that corresponds to two or more identifier bits. For instance, identifier bits 1052 includes a group of devices on wordline0 910 that are on bitlines 930, 931, 932, and 935. Likewise, identifier group 1054 includes devices on wordlineN 912 that are on bitlines 930, 933, 934, and 935. In both 1052 and 1054, some devices are adjacent, while other devices are non-adjacent. In contrast, identifier bits 1056 are a single group of devices adjacent to one other on wordline 912 and bitlines 936-939. In general, devices on the same wordline that are grouped can have any adjacency or non-adjacency (e.g., none adjacent to each other, all adjacent to each other, one or more non-adjacent sets of devices (e.g., comprising one or more devices) adjacent to other devices in that set, etc.). Identifier bits 1052, 1054, and 1056, as well as other suitable combinations, can be defined by controller 160 of FIG. 1, infra. Thus, differential grouping 1050 can mix groupings of devices on adjacent bitlines, with groupings of devices on non-adjacent bitlines in some disclosed embodiments.

Figure 11:
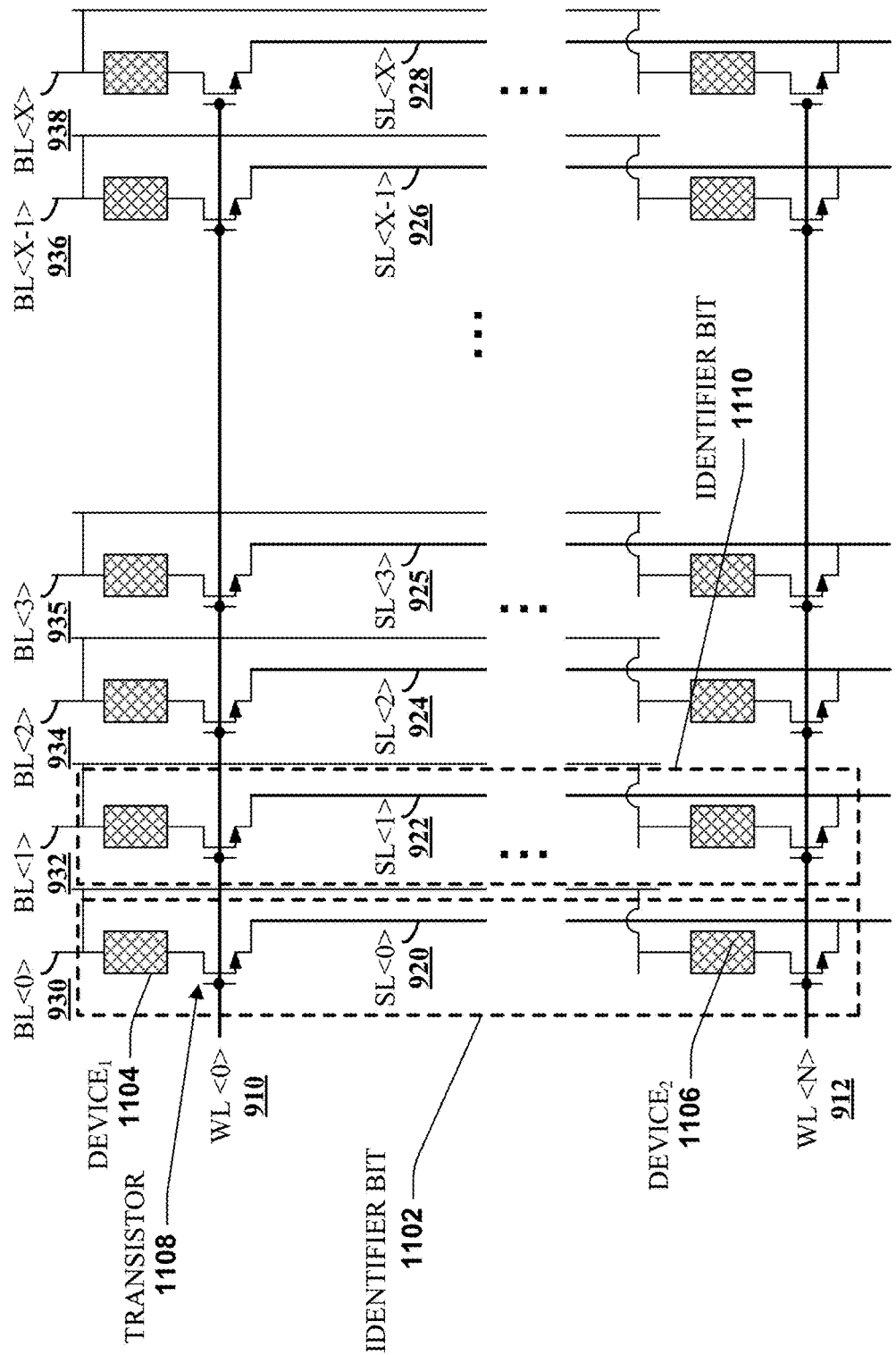
FIG. 11 illustrates a sample schematic diagram of groups of RS devices for differential processes to generate identifier bit data in still other embodiments.

FIG. 11 depicts a schematic diagram of an example array of resistive switching devices providing still another alternative definition of differential grouping 1100 of identifier bits 1102, 1110 according to further embodiments of the present disclosure. As depicted, differential grouping 1100 defines multiple resistive switching devices on a common bitline 930, 932, . . . , as identifier bits 1102, 1110, respectively. Although the example array of FIG. 11 accommodates one or more wordlines between wordline0 910 and wordlineN 912, identifier bits 1102 and 1110 can group resistive switching devices on adjacent wordlines, in an embodiment, through the subject disclosure is not so limited and identifier bits can include groups of resistive switching devices on non-adjacent wordlines as well. Differential operational characteristics of respective resistive switching devices of each identifier bit 1102, 1110 can be utilized to generate identifier data for each identifier bit 1102, 1110, as described herein (e.g., see FIG. 9). However, the subject disclosure is not so limited, and the explicitly disclosed definitions of differential operational characteristics with identifier bit data as well as those reasonably conveyed to one of ordinary skill in the art by way of the context provided herein are considered within the scope of the present disclosure.

Figure 12:
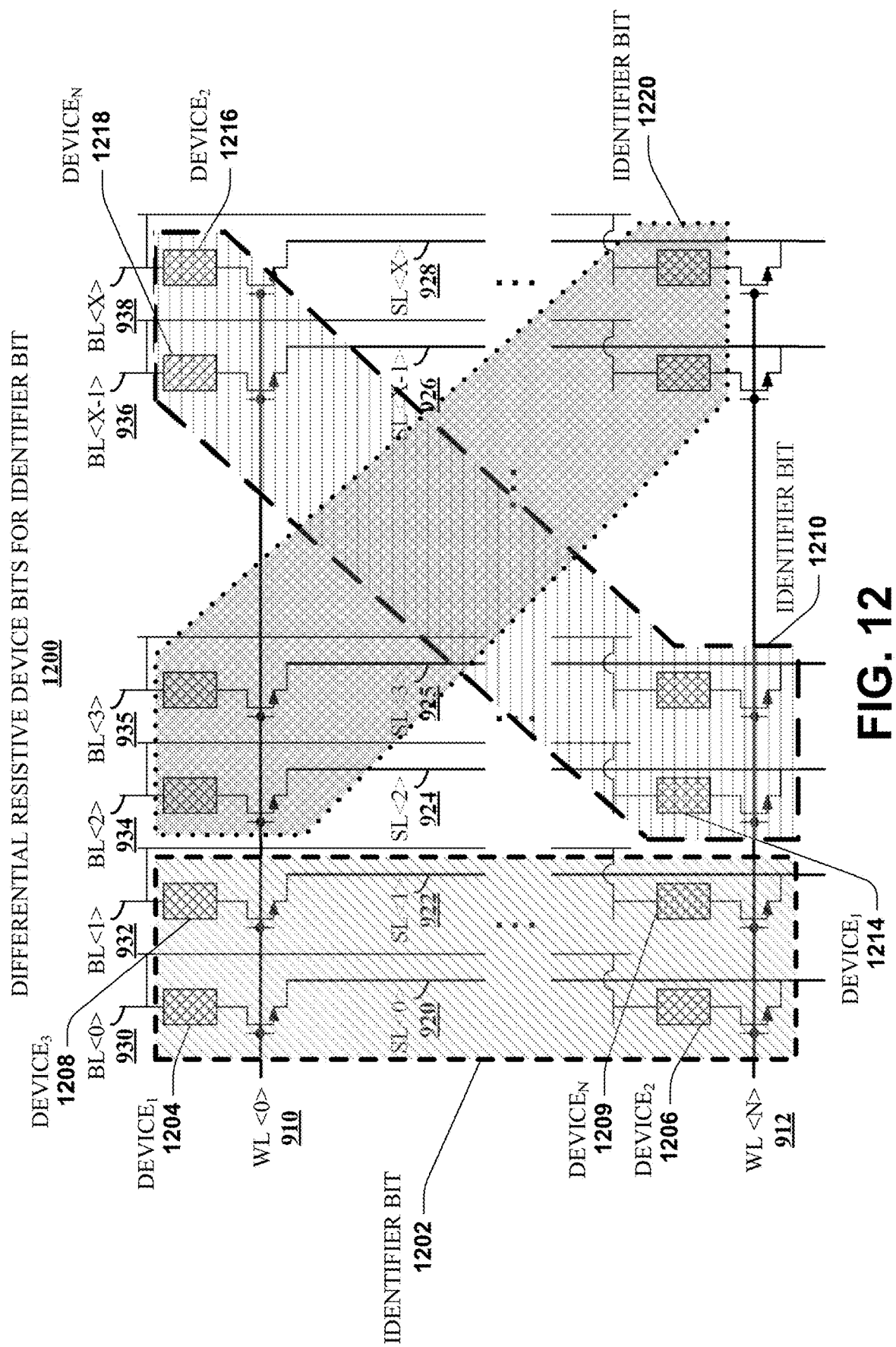
FIG. 12 depicts an example schematic diagram of groups of RS devices for differential processes to generate identifier bit data according to yet further embodiments.

FIG. 12 depicts a schematic diagram of an example array of resistive switching devices providing still another definition of differential grouping 1200 of identifier bits 1202, 1210, 1220 according to still other embodiments of the present disclosure. Particularly, differential grouping 1200 allows grouping of resistive switching devices on different bitlines as well as different wordlines into an identifier group. For instance, identifier bit 1202 includes resistive switching devices on bitlines 930, 932 and wordlines 910, 912. Moreover, identifier bits 1210 and 1220 group resistive switching devices in non-adjacent bitlines with other resistive switching devices on different wordlines. It should be appreciated that any regular or irregular grouping of resistive switching devices into an identifier bit(s) can also be accomplished according to various embodiments of the present disclosure, and the scope of the disclosure is not limited to those explicitly depicted. Moreover, identifier bits 1202, 1210, 1220 incorporate four resistive switching devices each. This allows dual-bit binary data for each identifier bit 1202, 1210, 1220 even for single threshold qualitative criterion, such as the first device to program within an identifier bit in response to a program voltage applied to all devices. For example, identifier bit=00 if device1 1204 is first to program; =01 if device2 1206 is first to program; =10 if device3 1208 is first to program; =11 if deviceN 1209 is first to program, or a similar definition. In some embodiments, a number N of resistive switching devices per identifier bit can equal 2x where x is the number of bits of a multi-bit binary number. In other embodiments, differential quantitative threshold metrics can be employed to increase the multi-bit capacity of each identifier bit with four resistive switching devices per identifier bit, analogous to that described above at FIG. 9. Other variations and combinations known in the art or reasonably suggested to one of ordinary skill in the art by way of the context provided herein are considered within the scope of the present disclosure.

The diagrams included herein are described with respect to several components, layers and materials of a resistive switching device or a die or wafer comprising many resistive switching devices. It should be appreciated that such diagrams can include those components, layers and materials specified therein, some of the specified components/layers/materials, or additional components/layers/materials not explicitly depicted but known in the art or reasonably conveyed to those of skill in the art by way of the context provided herein. Sub-layers can also be implemented as adjacent other sub-layers within a depicted layer. Further, embodiments within a particular Figure of the present specification can be applied in part or in whole to other embodiments depicted in other Figures, where suitable, and vice versa. As an illustrative example, switching device layer stack 300 of FIG. 3 can be utilized to form arrays of resistive switching devices as illustrated in FIGS. 9-12, which can in turn be included with array of RS devices 105 of FIG. 1, or memory array 1402 of FIG. 14, or volatile memory 1510A or non-volatile memory 1510B of FIG. 15, and so forth. Additionally, it is noted that one or more disclosed processes can be combined into a single process providing aggregate functionality. For instance, a deposition process can comprise an etching process, or vice versa, to facilitate depositing and etching a component of an integrated circuit device by way of a single process. Components of the disclosed architectures can also interact with one or more other components not specifically described herein but known by those of skill in the art.

To generate a random number, various embodiments can employ virgin cells (e.g., resistive switching devices of array 105, etc.) to generate the random number from a PUF according to any of the various techniques discussed herein. Once the cells are programmed and erased, they will not return to their native states, and some of the quantum mechanical variability of those cells that gave rise to the high degree of randomness may be lost, and some correlation between the cells may arise.

Considering the scenario of generating a random number based on differential programming techniques discussed herein. To generate an N-bit random number, N pairs (or other suitable number, such as four, eight, etc.) of RS devices can be selected, a program voltage can be applied to each pair (or group), and whichever RS device of the pair (group) programs first can determine the value of the corresponding bit of the N-bit random number (e.g., if each pair comprises a RS device on an odd bitline and a RS device on an even bitline, the corresponding bit can equal the digital value of the RS device on the even bitline, or alternatively that of the RS device on the odd bitline, etc.). Various embodiments can employ groups of RS devices, where each group can have the same number (e.g., 2 or more, etc.) of RS devices, etc., and the number and size of groups can determine the size of the random number generated. Once generated the random number can be output (e.g., if generated in response to a random number generation command) or can be stored within a portion of the RS devices utilized to generate the random number, or can be exported for storage external to the RS devices utilized to generate the random number. While the initial generation of a random number from these N pairs (or groups, etc.) of RS devices can have maximal randomness, if the process were repeated, some of the RS devices will have been programmed (and can thus be programmed more easily than native RS devices, etc.), and others will not have been.

In various embodiments, non-native RS devices can be re-used to generate additional random numbers, by placing each of the non-native RS devices in the same state, or as close as possible to the same state, because then the results of differential programming will remain random. To place each of the RS devices into as close as possible to the same state, after the random number is determined, the remaining RS devices that were not programmed as part of the differential programming can also be programmed (e.g., via applying a programming pulse to all of the RS devices, which will only change the state of RS devices not yet programmed, etc.), so that each of the RS devices have been programmed the same number of times (once, if starting from the native state, or M times in general, where M is a number greater than one, etc.). At that point, each of the RS devices can be erased, and returned to essentially the same state (e.g., programmed and erased M times, etc.) with similar amount of program/erase wear on each RS device, aside from random variations. As the RS devices are repeatedly programmed and erased, random numbers can be generated. This process (differentially programming the RS devices, determining a random number from the differentially programmed RS devices, programming all of the RS devices to have a similar program count within a threshold, and erasing all of the RS devices to have a similar program/erase count within a threshold) can be repeated a large number of times (e.g., on the order of 10,000, etc.) with a set of RS devices before the repeated wear and/or mechanical breakdown on them renders them insufficiently random (e.g., wherein sufficient randomness is determined according to various metrics discussed herein, etc.) for generation of random numbers (e.g., such RS devices can still be repurposed for other purposes such as data storage, etc.).

In some embodiments, a set of RS devices that have each been programmed and erased the same number of times can be used together for consecutive generation of one or more random numbers. In other embodiments, non-native RS devices can be used together for consecutive generation of one or more random numbers when the RS devices have been programmed and erased within a threshold number of times as each other. For example, non-native RS devices have respective program/erase counts within a threshold number of: +/−3 times, within +/−five times, within +/−ten times, within +/−50 times, within +/−100 times, or other suitable range of program and erase counts per RS device can be grouped together to generate a digital value. Additionally, in the case of many groups (e.g., 64 groups, 128 groups, 256 groups, 512 groups, 1024 groups, etc.) a number of digital values matching the number of groups can be generated, having good non-correlation or randomness, and can then be concatenated to form a digital random number sequence with a number of bits matching the number of groups (e.g., a 64-bit random number sequence, 128-bit random number sequence, 256-bit random number sequence, 512-bit random number sequence 1024-bit random number sequence, and so forth).

Figure 13:
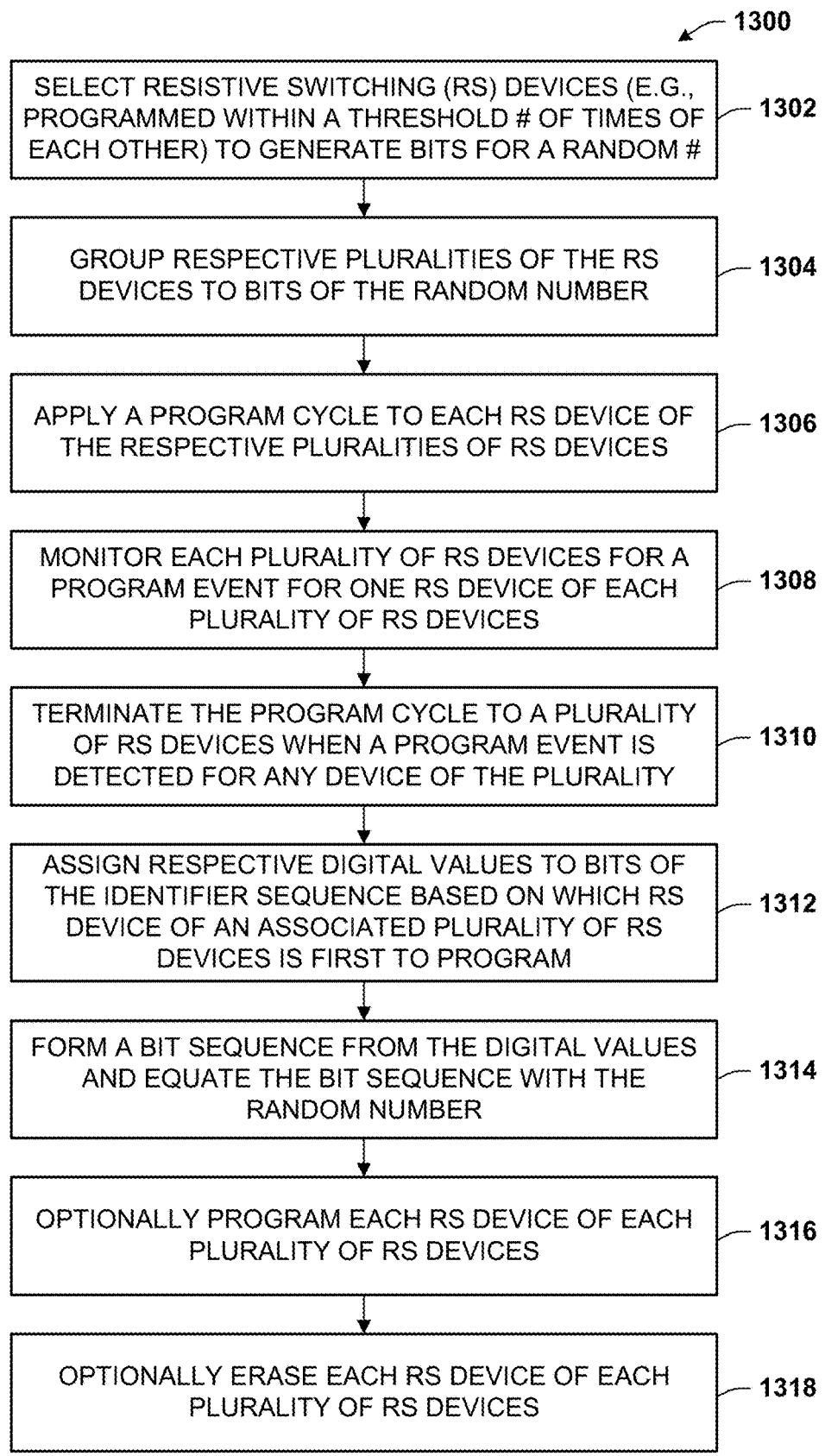
FIG. 13 illustrates a flowchart of a sample method for generating random number(s) from differential program events of groups of RS devices, in an embodiment(s)

In view of the exemplary diagrams described supra, process methods that can be implemented in accordance with the disclosed subject matter will be better appreciated with reference to the flow charts of FIG. 13. While for purposes of simplicity of explanation, the method of FIG. 13 is shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein, and in some embodiments additional steps known in the art or reasonably conveyed to one of ordinary skill in the art by way of the context provided herein are also considered within the scope of the present disclosure. Moreover, some steps illustrated as part of one process can be implemented for another process where suitable; other steps of one or more processes can be added or substituted in other processes disclosed herein within the scope of the present disclosure. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 13 depicts a flowchart of a sample method 1300 according to various embodiments of the present disclosure. At 1302, method 1300 can comprise selecting a set of resistive switching devices (e.g., each in an unprogrammed or erased state, etc.) on a die to generate bits for a random number. In various embodiments, the set of RS devices can all have been programmed and erased the same number of times (e.g., any non-negative integer, such as 0, 1, 2, etc.), or can be non-native RS devices that have been programmed and erased within a threshold number of times of one another (e.g., any positive integer, such as 1, 2, 3, etc.). At 1304, method 1300 can comprise grouping respective pluralities (e.g., pairs, n-tuples, etc.) of the set of resistive switching devices to bits of the identifier sequence. In an embodiment, a plurality of resistive switching devices grouped to an identifier bit can be devices on a wordline and adjacent bitlines of an array, devices on a bitline and adjacent wordlines of the array, devices on the wordline and non-adjacent bitlines of the array, devices on the bitline and non-adjacent wordlines of the array, or devices on non-adjacent wordlines and non-adjacent bitlines of the array, or suitable combinations of the foregoing.

At 1306, method 1300 can comprise applying a program cycle to each resistive switching device of the respective pluralities of resistive switching devices. At 1308, method 1300 can monitor each plurality of resistive switching devices for a program event among resistive switching devices of each plurality of resistive switching devices. In some embodiments, this can be a first program event. In other embodiments, it can be an Mth program event, where M is a positive integer less than the number of resistive switching devices in the plurality. To generate a random number with a comparable number of 1s and 0s, for 2N resistive switching devices in each plurality, the monitored program event can be the Nth program event among resistive switching devices of the plurality. At 1310, method 1300 can comprise terminating the program cycle to a plurality of resistive switching devices in response to detecting the monitored—for program event among the plurality of resistive switching devices. At 1312, method 1300 can comprise assigning respective digital values to bits of the random number based on which resistive switching device of an associated plurality of resistive switching devices is first to exhibit a program event. As an example, where a pair of resistive switching devices is grouped to an identifier bit, if a first resistive switching device (e.g., a device connected to a first bitline of a pair of bitlines, a first wordline of a pair of wordlines, a first bitline and first wordline of a pair of bitlines and wordlines, or other suitable definition and arrangement) is first to exhibit the program event, the identifier bit can be assigned a first digital value (e.g., '0', or '1') and if a second resistive switching device is first to exhibit the program event, the identifier bit can be assigned a second digital value (e.g., '1' or '0', respectively). At 1314, method 1300 can comprise forming a bit sequence from the digital values and equate the bit sequence with the identifier sequence. In various embodiments, method 1300 can further comprise outputting the bit sequence to an external device, or storing the bit sequence external to the set of resistive switching devices (e.g., other memory on the die separate from the set of resistive switching devices used to generate the bit sequence, or memory on another die accessed by a communication interface to the other die, or the like).

At 1316, method 1300 can comprise optionally applying a program pulse to each resistive switching device of the set of resistive switching devices. At 1318, method 1300 can comprise optionally erasing each resistive switching device of the set of resistive switching devices. Optional acts 1316 and 1318 can be performed to reset the set of resistive switching devices for generation of a subsequent random number. In other embodiments, similar acts can alternately be performed before 1302 on resistive switching devices in a variety of states (e.g., programmed and unprogrammed, etc.) to ensure that each resistive switching device of the set is an erased state for act 1302. In various embodiments, method 1300 can be repeated one or more times (e.g., on the order of 10,000, etc.). In some embodiments, resistive switching devices can have the same grouping at 1304 in multiple iterations of method 1300, while in other embodiments, the grouping of resistive switching devices can vary between iterations of method 1300.

Example Operating Environments

Figure 14:
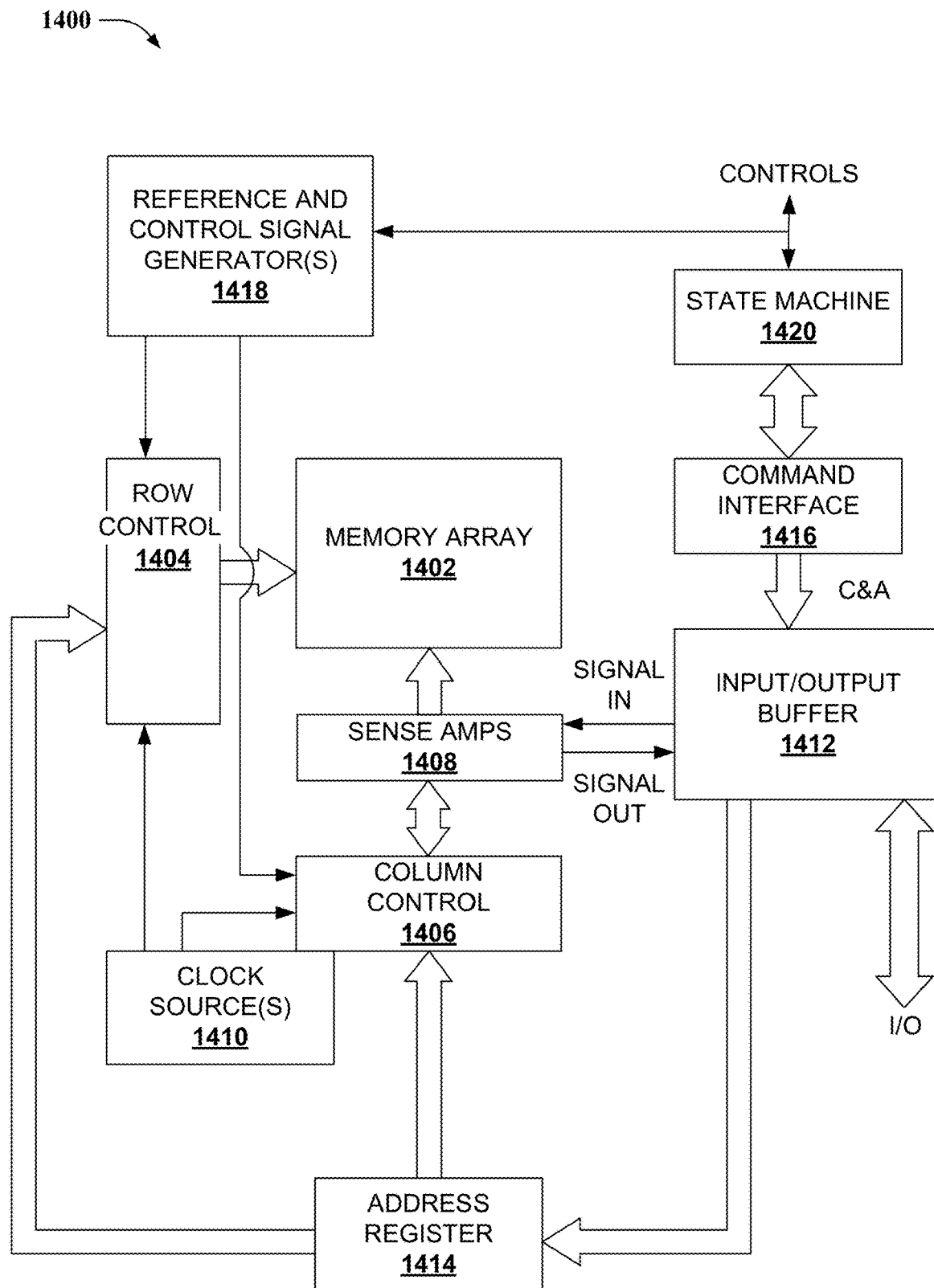
FIG. 14 illustrates a block diagram of a sample electronic operating environment in accordance with certain embodiments presented herein.

FIG. 14 illustrates a block diagram of an example operating and control environment 1400 for a memory array 1402 of a memory cell array according to aspects of the subject disclosure. Control environment 1400 and memory array 1402 can be formed within a single semiconductor die in some embodiments, although the subject disclosure is not so limited and in other embodiments some components of control environment 1400 can be formed on a separate semiconductor die. In at least one aspect of the subject disclosure, memory array 1402 can comprise memory selected from a variety of memory cell technologies. In at least one embodiment, memory array 1402 can comprise a two-terminal memory technology, arranged in a compact two or three-dimensional architecture. Suitable two-terminal memory technologies can include resistive-switching memory, conductive-bridging memory, phase-change memory, organic memory, magneto-resistive memory, or the like, or a suitable combination of the foregoing. In a further embodiment, the two-terminal memory technology can be a two-terminal resistive switching technology.

A column controller 1406 and sense amps 1408 can be formed adjacent to memory array 1402. Moreover, column controller 1406 can be configured to activate (or identify for activation) a subset of bit lines of memory array 1402. Column controller 1406 can utilize a control signal provided by a reference and control signal generator(s) 1418 to activate, as well as operate upon, respective ones of the subset of bitlines, applying suitable program, erase or read voltages to those bitlines. Non-activated bitlines can be kept at an inhibit voltage (also applied by reference and control signal generator(s) 1418), to mitigate or avoid bit-disturb effects on these non-activated bitlines.

In addition, operating and control environment 1400 can comprise a row controller 1404. Row controller 1404 can be formed adjacent to and electrically connected with word lines of memory array 1402. Also utilizing control signals of reference and control signal generator(s) 1418, row controller 1404 can select particular rows of memory cells with a suitable selection voltage. Moreover, row controller 1404 can facilitate program, erase or read operations by applying suitable voltages at selected word lines.

Sense amps 1408 can read data from, or write data to, the activated memory cells of memory array 1402, which are selected by column control 1406 and row control 1404. Data read out from memory array 1402 can be provided to an input/output buffer 1412. Likewise, data to be written to memory array 1402 can be received from the input/output buffer 1412 and written to the activated memory cells of memory array 1402.

A clock source(s) 1410 can provide respective clock pulses to facilitate timing for read, write, and program operations of row controller 1404 and column controller 1406. Clock source(s) 1410 can further facilitate selection of word lines or bit lines in response to external or internal commands received by operating and control environment 1400. Input/output buffer 1412 can comprise a command and address input, as well as a bidirectional data input and output. Instructions are provided over the command and address input, and the data to be written to memory array 1402 as well as data read from memory array 1402 is conveyed on the bidirectional data input and output, facilitating connection to an external host apparatus, such as a computer or other processing device (not depicted, but see e.g., computer 1502 of FIG. 15, infra).

Input/output buffer 1412 can be configured to receive write data, receive an erase instruction, receive a status or maintenance instruction, output readout data, output status information, and receive address data and command data, as well as address data for respective instructions. Address data can be transferred to row controller 1404 and column controller 1406 by an address register 1414. In addition, input data is transmitted to memory array 1402 via signal input lines between sense amps 1408 and input/output buffer 1412, and output data is received from memory array 1402 via signal output lines from sense amps 1408 to input/output buffer 1412. Input data can be received from the host apparatus, and output data can be delivered to the host apparatus via the I/O bus.

Commands received from the host apparatus can be provided to a command interface 1416. Command interface 1416 can be configured to receive external control signals from the host apparatus, and determine whether data input to the input/output buffer 1412 is write data, a command, or an address. Input commands can be transferred to a state machine 1420.

State machine 1420 can be configured to manage programming and reprogramming of memory array 1402 (as well as other memory banks of a multi-bank memory array). Instructions provided to state machine 1420 are implemented according to control logic configurations, enabling state machine 1420 to manage read, write, erase, data input, data output, and other functionality associated with memory cell array 1402. In some aspects, state machine 1420 can send and receive acknowledgments and negative acknowledgments regarding successful receipt or execution of various commands. In further embodiments, state machine 1420 can decode and implement status-related commands, decode and implement configuration commands, and so on.

To implement read, write, erase, input, output, etc., functionality, state machine 1420 can control clock source(s) 1410 or reference and control signal generator(s) 1418. Control of clock source(s) 1410 can cause output pulses configured to facilitate row controller 1404 and column controller 1406 implementing the particular functionality. Output pulses can be transferred to selected bit lines by column controller 1406, for instance, or word lines by row controller 1404, for instance.

Figure 15:
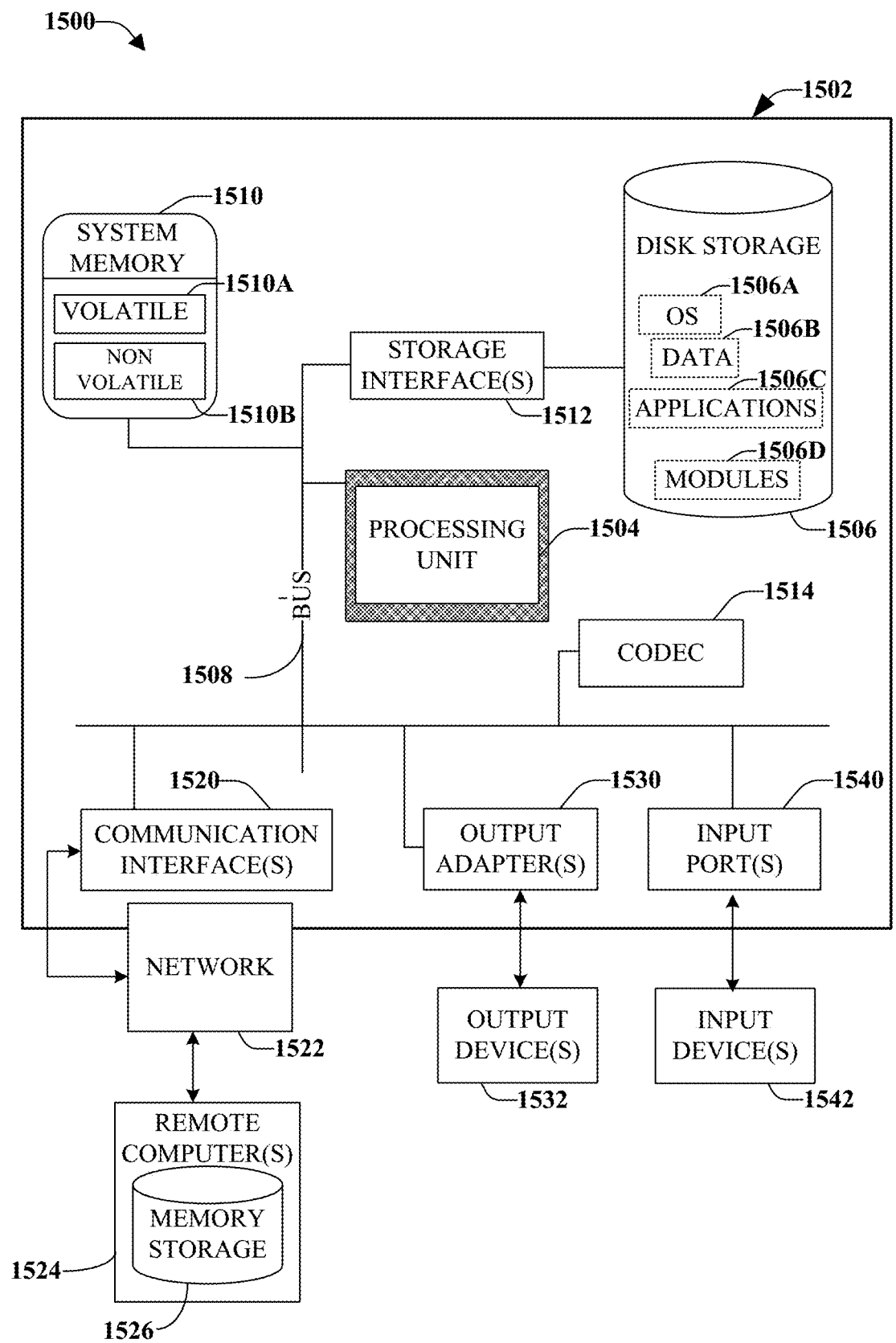
FIG. 15 depicts a block diagram of an example computing environment for implementing one or more disclosed embodiments of the present disclosure.

In connection with FIG. 15, the systems, devices, and/or processes described herein can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

With reference to FIG. 15, a suitable environment 1500 for implementing various aspects of the claimed subject matter includes a computer 1502. The computer 1502 includes a processing unit 1504, a system memory 1510, a codec 1514, and a system bus 1508. The system bus 1508 couples system components including, but not limited to, the system memory 1510 to the processing unit 1504. The processing unit 1504 can be any of various available processors. Dual microprocessors and other multiprocessor architectures also can be employed as the processing unit 1504.

The system bus 1508 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1510 includes volatile memory 1510A and non-volatile memory 1510B. The basic input/output system (BIOS), containing the basic routines to transfer information between elements within the computer 1502, such as during start-up, is stored in non-volatile memory 1510B. In addition, according to present innovations, codec 1514 may include at least one of an encoder or decoder, wherein the at least one of an encoder or decoder may consist of hardware, software, or a combination of hardware and software. Although, codec 1514 is depicted as a separate component, codec 1514 may be contained within non-volatile memory 1510B. By way of illustration, and not limitation, non-volatile memory 1510B can include read only memory (ROM), programmable ROM (PROM), electrically programmable ROM (EPROM), electrically erasable programmable ROM (EEPROM), or flash memory, two-terminal memory, and so on. Volatile memory 1510A includes random access memory (RAM), and in some embodiments can embody a cache memory. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ES-DRAM).

Computer 1502 may also include removable/non-removable, volatile/non-volatile computer storage medium. FIG. 15 illustrates, for example, disk storage 1506. Disk storage 1306 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1506 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1506 to the system bus 1508, a removable or non-removable interface is typically used, such as storage interface 1512. It is appreciated that storage devices 1506 can store information related to a user. Such information might be stored at or provided to a server or to an application running on a user device. In one embodiment, the user can be notified (e.g., by way of output device(s) 1532) of the types of information that are stored to disk storage 1506 or transmitted to the server or application. The user can be provided the opportunity to opt-in or opt-out of having such information collected and/or shared with the server or application (e.g., by way of input from input device(s) 1542).

It is to be appreciated that FIG. 15 describes software that acts as an intermediary between users and the basic computer resources described in the suitable operating environment 1500. Such software includes an operating system 1506A. Operating system 1506A, which can be stored on disk storage 1506, acts to control and allocate resources of the computer system 1502. Applications 1506C take advantage of the management of resources by operating system 1506A through program modules 1506D, and program data 1506D, such as the boot/shutdown transaction table and the like, stored either in system memory 1510 or on disk storage 1506. It is to be appreciated that the claimed subject matter can be implemented with various operating systems or combinations of operating systems.

A user enters commands or information into the computer 1502 through input device(s) 1542. Input devices 1542 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1504 through the system bus 1508 via input port(s) 1540. Input port(s) 1540 include, for example, a serial port, a parallel port, a game port, and a universal serial bus (USB). Output device(s) 1532 use some of the same type of ports as input device(s) 1542. Thus, for example, a USB port may be used to provide input to computer 1502 and to output information from computer 1502 to an output device 1532. Output adapter 1530 is provided to illustrate that there are some output devices 1532 like monitors, speakers, and printers, among other output devices 1532, which require special adapters. The output adapters 1530 include, by way of illustration and not limitation, video and sound cards that provide a means of connection between the output device 1532 and the system bus 1508. It should be noted that other devices and/or systems of devices provide both input and output capabilities such as remote computer(s) 1538.

Computer 1502 can operate in a networked environment using logical connections to one or more remote computers, such as remote computer(s) 1524. The remote computer(s) 1524 can be a personal computer, a server, a router, a network PC, a workstation, a microprocessor based appliance, a peer device, a smart phone, a tablet, or other network node, and typically includes many of the elements described relative to computer 1502. For purposes of brevity, only a memory storage device 1526 is illustrated with remote computer(s) 1524. Remote computer(s) 1524 is logically connected to computer 1502 through a network 1522 and then connected via communication interface(s) 1520. Network 1522 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication interface(s) 1520 refers to the hardware/software employed to connect the network 1522 to the bus 1508. While communication interface(s) 1520 is shown for illustrative clarity inside computer 1502, it can also be external to computer 1502. The hardware/software necessary for connection to the network 1522 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising".

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Further embodiments can be envisioned to one of ordinary skill in the art after reading this disclosure. For example, in various embodiments, erase operations may be initiated upon a plurality of ReRAM devices (e.g. 16, 32, etc.) at the same time.

In other embodiments, combinations or sub-combinations of the above disclosed embodiments can be advantageously made. The block diagrams of the architecture and flow charts are grouped for ease of understanding. However, it should be understood that combinations of blocks, additions of new blocks, re-arrangement of blocks, and the like are contemplated in alternative embodiments of the present disclosure.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for operating an array of non-volatile resistive switching devices, comprising:
    defining a first group of resistive switching devices to include a first resistive switching device and a second resistive switching device, and defining a second group of resistive switching devices to include a third resistive switching device and a fourth resistive switching device;
    applying a programming signal to each resistive switching device defined for the first group and for each resistive switching device defined for the second group;
    monitoring for a program event among the resistive switching devices of the first group and for a second program event among the resistive switching devices of the second group;
    terminating the programming signal for the first group of resistive switching devices in response to detecting the program event for the first resistive switching device or for the second resistive switching device;
    terminating the programming signal for the second group of resistive switching devices in response to detecting the second program event for the third resistive switching device or for the fourth resistive switching device; and
    assign a first digital value to the first group of resistive switching devices and assign a second digital value to the second group of resistive switching devices.

2. The method of claim 1, further comprising forming a random or pseudo-random number from the first digital value and from the second digital value.

3. The method of claim 2, further comprising storing the random or pseudo-random number, or outputting the random or pseudo-random number to an external device.

4. The method of claim 1, wherein assigning the first digital value to the first group of resistive switching devices further comprises one of:
    defining a first binary bit value for the first group in response to detecting the program event for the first resistive switching device; or
    defining a second binary bit value for the first group in response to detecting the program event for the second resistive switching device.

5. The method of claim 1, further comprising:
    incrementing a program cycle count for the first resistive switching device in response to detecting the program event for the first resistive switching device; and
    incrementing a second program cycle count for the third resistive switching device in response to detecting the second program event for the third resistive switching device.

6. The method of claim 5, further comprising:
    comparing the program cycle count with the second program cycle count and determining a difference between respective program cycle count values of the first resistive switching device and the third resistive switching device;
    determining whether the difference between the respective program cycle count values is equal to or less than a threshold value; and
    defining a third group of resistive switching devices to include the first resistive switching device and the third resistive switching device in response to determining the difference is equal to or below the threshold value.

7. The method of claim 6, further comprising selecting the threshold value to be 10 program cycle counts or fewer.

8. The method of claim 6, further comprising selecting the threshold value to be 1 program cycle count or fewer.

9. The method of claim 6, further comprising:
    comparing a third program cycle count associated with the second resistive switching device with a fourth program cycle count associated with the fourth resistive switching device;
    determining a second difference between respective program cycle count values of the second resistive switching device and of the fourth resistive switching device;
    determining whether the second difference between the respective program cycle count values of the second resistive switching device and the fourth resistive switching device is equal to or less than the threshold value or a second threshold value; and
    defining a fourth group of resistive switching devices to include the second resistive switching device and the fourth resistive switching device in response to determining the second difference is equal to or below the threshold value or the second threshold value.

10. The method of claim 9, further comprising:
    applying the programming signal to each resistive switching device defined for the third group and for each resistive switching device defined for the fourth group;
    monitoring for additional program events among the resistive switching devices of the third group and of the fourth group;
    terminating the programming signal for the third group in response to detecting an additional program event for the first resistive switching device or for the third resistive switching device;
    terminating the programming signal for the fourth group in response to detecting a second additional program event for the second resistive switching device or for the fourth resistive switching device; and assign a third digital value to the third group of resistive switching devices and assign a fourth digital value to the fourth group of resistive switching devices.

11. The method of claim 10, further comprising forming a second random or pseudo-random number from the third digital value and from the fourth digital value.

12. A memory device, comprising:
an array of non-volatile resistive switching devices comprising a first resistive switching device, a second resistive switching device, a third resistive switching device and a fourth resistive switching device;
an electrical power source;
a timing circuit;
an embedded memory storing trim instructions; and
a memory controller operatively coupled to the array, the electrical power source, the timing circuit and the embedded memory, wherein the memory controller is configured to execute the trim instructions to implement an operation on the array of non-volatile resistive switching devices, the trim instructions comprising instructions for:
defining a first group of resistive switching devices to include the first resistive switching device and a second resistive switching device;
defining a second group of resistive switching devices to include the third resistive switching device and a fourth resistive switching device;
applying a programming signal via the electrical power source and the timing circuit to each of the first group of resistive switching devices and to each of the second group of resistive switching devices;
monitoring for a program event among the first group of resistive switching devices and for a second program event among the second group of resistive switching devices;
terminating the programming signal for the first group in response to detecting the program event for the first resistive switching device or for the second resistive switching device;
terminating the programming signal for the second group in response to detecting the second program event for the third resistive switching device or for the fourth resistive switching device; and
assign a first digital value to the first group of resistive switching devices and assign a second digital value to the second group of resistive switching devices.

13. The memory device of claim 12, wherein the trim instructions further comprise an instruction for generating a number from the first digital value and from the second digital value.

14. The memory device of claim 13, wherein the trim instructions further comprise storing the number within the array, or within the embedded memory.

15. The memory device of claim 13, further comprising a communication interface communicatively coupled to the memory controller and operable to communicatively couple to a host device, wherein the trim instructions further comprise outputting the number to the host device by way of the communication interface.

16. The memory device of claim 13, wherein the trim instructions further comprise, following generating the number from the first digital value and from the second digital value, generating a second number, wherein generating the second number comprises:
re-applying the programming signal via the electrical power source and the timing circuit to each of the first group of resistive switching devices and to each of the second group of resistive switching devices;
monitoring for a third program event among the first group of resistive switching devices and for a fourth program event among the second group of resistive switching devices;
terminating the programming signal for the first group in response to detecting the third program event and terminating the programming signal for the second group in response to detecting the fourth program event;
determine whether the third program event occurred for the first resistive switching device or the second resistive switching device and assign a third digital value to the first group of resistive switching devices; and
determine whether the fourth program event occurred for the third resistive switching device or the fourth resistive switching device and assign a fourth digital value to the second group of resistive switching devices.

17. The memory device of claim 16, wherein:
the trim instructions further comprise assigning the third digital value by one of:
selecting a '0' bit value for the third digital value in response to determining the third program event occurred for the first resistive switching device; or
selecting a '1' bit value for the third digital value in response to determining the third program event occurred for the second resistive switching devices; and
the trim instructions further comprise assigning the fourth digital value by one of:
selecting the '0' bit value for the fourth digital value in response to determining the fourth program event occurred for the third resistive switching device; or
selecting the '1' bit value for the fourth digital value in response to determining the fourth program event occurred for the fourth resistive switching device.

18. The memory device of claim 16, wherein generating the second number further comprises concatenating the third digital value and the fourth digital value.

19. The memory device of claim 12, wherein the trim instructions further comprise:
incrementing a program cycle count for the second resistive switching device in response to detecting the program event for the second resistive switching device;
incrementing a second program cycle count for the fourth resistive switching device in response to detecting the second program event for the fourth resistive switching device;
defining a third group of resistive switching devices to include the second resistive switching device and the fourth resistive switching device; and
defining a fourth group of resistive switching devices to include a fifth resistive switching device and a sixth resistive switching device each having respective program cycle counts within a threshold value from the program cycle count and from the second program cycle count.

20. The memory device of claim 19, wherein the trim instructions further comprise:
re-applying the programming signal via the electrical power source and the timing circuit to each of the third group of resistive switching devices and to each of the fourth group of resistive switching devices;

monitoring for a third program event among the third group of resistive switching devices and for a fourth program event among the fourth group of resistive switching devices;

terminating the programming signal for the third group in response to detecting the third program event and terminating the programming signal for the fourth group in response to detecting the fourth program event;

determine whether the third program event occurred for the second resistive switching device or the fourth resistive switching device and assign a third digital value to the third group of resistive switching devices;

determine whether the fourth program event occurred for the fifth resistive switching device or the sixth resistive switching device and assign a fourth digital value to the fourth group of resistive switching devices; and generate a number from the third digital value and from the fourth digital value.

* * * * *